(12) United States Patent
Matsubara et al.

(10) Patent No.: US 8,274,088 B2
(45) Date of Patent: Sep. 25, 2012

(54) SURFACE-EMITTING LASER ELEMENT, FABRICATION METHOD THEREOF, SURFACE-EMITTING LASER ARRAY, AND FABRICATION METHOD THEREOF

(75) Inventors: Hideki Matsubara, Osaka (JP); Hirohisa Saito, Osaka (JP); Fumitake Nakanishi, Osaka (JP); Shinji Matsukawa, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 611 days.

(21) Appl. No.: 12/376,911

(22) PCT Filed: May 21, 2007

(86) PCT No.: PCT/JP2007/060366
§ 371 (c)(1),
(2), (4) Date: Feb. 9, 2009

(87) PCT Pub. No.: WO2008/018220
PCT Pub. Date: Feb. 14, 2008

(65) Prior Publication Data
US 2010/0172390 A1    Jul. 8, 2010

(30) Foreign Application Priority Data
Aug. 11, 2006  (JP) .................... 2006-220203

(51) Int. Cl.
*H01L 31/12* (2006.01)
*H01L 33/00* (2010.01)
(52) U.S. Cl. .............. 257/79; 257/13; 257/15; 257/103; 257/E33.005; 257/E33.023; 372/50.12; 438/41; 438/46; 438/32

(58) Field of Classification Search .............. 438/31–46; 257/E33.005, E33.023
See application file for complete search history.

(56) References Cited

U.S. PATENT DOCUMENTS

| | | | |
|---|---|---|---|
| 2004/0164308 | A1 | 8/2004 | Asatsuma et al. |
| 2005/0042787 | A1 | 2/2005 | Ito et al. |
| 2005/0141577 | A1 | 6/2005 | Ueta et al. |
| 2005/0227392 | A1 | 10/2005 | Asatsuma et al. |

FOREIGN PATENT DOCUMENTS

| | | |
|---|---|---|
| CN | 1582520 A | 2/2005 |
| JP | 2003-78214 | 3/2003 |
| JP | 2003-124115 | 4/2003 |
| JP | 2003-124572 | 4/2003 |
| JP | 2003-133649 | 5/2003 |
| JP | 2004-327655 | 11/2004 |
| JP | 2006-165255 | 6/2006 |

*Primary Examiner* — Mamadou Diallo
(74) *Attorney, Agent, or Firm* — Venable LLP; Michael A. Sartori; Leigh D. Thelen

(57) ABSTRACT

A fabrication method of a surface-emitting laser element includes a step of preparing a conductive GaN multiple-region substrate including a high dislocation density high conductance region, a low dislocation density high conductance region and a low dislocation density low conductance region, as a conductive GaN substrate; a semiconductor layer stack formation step of forming a group III-V compound semiconductor layer stack including an emission layer on the substrate; and an electrode formation step of forming a semiconductor layer side electrode and a substrate side electrode. The semiconductor layer and electrodes are formed such that an emission region into which carriers flow in the emission layer is located above and within the span of the low dislocation density high conductance region. Thus, a surface-emitting laser element having uniform light emission at the emission region can be obtained with favorable yield.

8 Claims, 14 Drawing Sheets

SURFACE-EMITTING LASER ELEMENT, FABRICATION METHOD THEREOF, SURFACE-EMITTING LASER ARRAY, AND FABRICATION METHOD THEREOF

TECHNICAL FIELD

The present invention relates to a surface-emitting laser element and a fabrication method thereof, and also a surface-emitting laser array and a fabrication method thereof. Specifically, the present invention relates to a surface-emitting laser element and a surface-emitting laser array having uniform light emission in an emission region, and fabrication methods of fabricating the same with favorable yield.

BACKGROUND ART

In order to obtain a semiconductor light emitting element with high light emitting intensity and reliability, a GaN substrate that is conductive and has a low dislocation density is required for a substrate directed to a semiconductor light emitting element. To this end, a conductive GaN substrate for a semiconductor light emitting element has dislocations intentionally concentrated in a crystal of the substrate to form a region of high dislocation density (hereinafter, referred to as high dislocation density region), and form a low dislocation density region of low dislocation density at regions other than the high dislocation density region. Approaches are made to fabricate a semiconductor light emitting element of high light emitting intensity and reliability by forming a plurality of semiconductor layers including an emission layer on such a low dislocation density region formed in a conductive GaN substrate to provide an LED (Light Emitting Diode) structure or stripe laser structure (for example, Japanese Patent Laying-Open Nos. 2003-124115 and 2003-124572).

Patent Document 1: Publication of Japanese Patent Laying-Open No. 2003-124115

Patent Document 2: Publication of Japanese Patent Laying-Open No. 2003-124572

DISCLOSURE OF THE INVENTION

Problems to be Solved by the Invention

However, the semiconductor light emitting elements disclosed in Japanese Patent Laying-Open Nos. 2003-124115 and 2003-124572 set forth above had the following problems. Specifically, in the case where a semiconductor light emitting element having a stripe laser structure is formed using a conductive GaN substrate, the yield in forming a Fabry-Perot resonator, for example, is reduced since the cleavage of the GaN substrate is insufficient.

Further, in the case where a semiconductor light emitting element with an LED structure is formed using a conductive GaN substrate, the event of light emission not being uniform in the emission region may occur even if the emission region of the LED structure is formed to be located above and within the span of the low dislocation density region. Accordingly, the yield of semiconductor light emitting elements will be degraded. Upon studying the cause, it was found that, in the low dislocation density region of the conductive GaN substrate, a subregion of high conductance (hereinafter, referred to as "low dislocation density high conductance region") and a subregion of low conductance (hereinafter, referred to as "low dislocation density low conductance region") are present. The high dislocation density region of the conductive GaN substrate is a region of high conductance, having a high carrier concentration as well as a high dislocation density. This high dislocation density region will be referred to as "high dislocation density high conductance region".

An object of the present invention is to provide a surface-emitting laser element and surface-emitting laser array having uniform light emission in the emission region, and fabrication methods of fabricating the same with favorable yield.

Means for Solving the Problems

The present invention is directed to a fabrication method of a surface-emitting laser element, and includes: a step of preparing a conductive GaN multiple-region substrate including a high dislocation density high conductance region having a high dislocation density and carrier concentration, a low dislocation density high conductance region having a dislocation density lower than the dislocation density of the high dislocation density high conductance region, and a low dislocation density low conductance region having a dislocation density and carrier concentration lower than the dislocation density and carrier concentration of the high dislocation density high conductance region, as a conductive GaN substrate; a semiconductor layer stack formation step of forming a group III-V compound semiconductor layer stack including an emission layer on one main surface of the conductive GaN multiple-region substrate; and an electrode formation step of forming a semiconductor layer side electrode on the uppermost layer of the group III-V compound semiconductor layer stack, and forming a substrate side electrode on an other main surface of the conductive GaN multiple-region substrate. The group III-V compound semiconductor layer stack, semiconductor layer side electrode, and substrate side electrode are formed such that an emission region into which carriers flow in the emission layer is limited to be located above and within the span of the low dislocation density high conductance region in the fabrication method of a surface-emitting laser device. According to such a fabrication method, a surface-emitting laser element having uniform light emission in the emission region by carriers flowing uniformly into the emission region can be readily achieved with favorable yield.

In the electrode formation step of the fabrication method of the surface-emitting laser element of the present invention, the semiconductor layer side electrode can be formed at a location above and within the span of the low dislocation density high conductance region such that the emission region is limited to be located above and within the span of the low dislocation density high conductance region. Further, in the semiconductor layer stack formation step, a carrier narrow region can be formed in the group III-V compound semiconductor layer stack such that the emission region is limited to be located above and within the span of the low dislocation density high conductance region. By such a fabrication method, the emission region can be limited to be located above and within the span of the low dislocation density high conductance region. A surface-emitting laser element having uniform light emission in the emission region by carriers flowing uniformly into the emission region can be achieved readily with favorable yield.

In the fabrication method of a surface-emitting laser element of the present invention, the high dislocation density high conductance region is in dots. Each dot of the high dislocation density high conductance region is located on periodic triangular lattice points or square lattice points with $P_D$ as the lattice constant on the main surface of the conductive GaN multiple-region substrate. The low dislocation density high conductance region may be a region excluding each dot from a circle region having a radius $P_D/2$ about the center of each dot. Further, the high dislocation density high conductance region can be in stripes. Each stripe of the high dislocation density high conductance region is arranged at a periodic interval $P_S$ on the main surface of the conductive GaN multiple-region substrate. The low dislocation density high conductance region may be a region excluding, from the entire region of the GaN multiple-region substrate, each stripe and the low dislocation density low conductance region formed with the center located $P_S/2$ from the center of each stripe. According to such a fabrication method, a surface-emitting laser element having uniform light emission in the emission region by uniform in-plane distribution of carriers flowing into the emission region can be readily achieved with favorable yield.

In the fabrication method of a surface-emitting laser element of the present invention, the high dislocation density high conductance region is a region having a dislocation density of at least $1\times10^6$ cm$^{-2}$ and a carrier concentration of at least $1\times10^{18}$ cm$^{-3}$. The low dislocation density high conductance region is a region having a dislocation density less than $1\times10^6$ cm' and a carrier concentration of at least $1\times10^{18}$ cm$^{-3}$. The low dislocation density low conductance region may be a region having a dislocation density less than $1\times10^6$ cm$^{-2}$ and a carrier concentration less than $1\times10^{18}$ cm$^{-3}$. By such a fabrication method, the emission region can be limited to be located above and within the span of a low dislocation density high conductance region having a dislocation density less than $1\times10^6$ cm$^{-2}$ and a carrier concentration of at least $1\times10^{18}$ cm$^{-3}$. Thus, the in-plane distribution of carriers flowing into the emission region is rendered uniform. A surface-emitting laser element having uniform light emission in the emission region and high light emitting efficiency can be achieved with favorable yield.

The present invention is directed to a surface-emitting laser element including a conductive GaN substrate, a group III-V compound semiconductor layer stack having an emission layer formed on one main surface of the conductive GaN substrate, a semiconductor layer side electrode formed on an uppermost layer of the group III-V compound semiconductor layer stack, and a substrate side electrode formed on an other main surface of the conductive GaN substrate. The conductive GaN substrate includes a low dislocation density high conductance region having a dislocation density less than $1\times10^6$ cm$^{-2}$ and a carrier concentration of at least $1\times10^{18}$ cm$^{-3}$. The emission region to which carriers flow in the emission layer is located above and within the span of the low dislocation density high conductance region. Since such a surface-emitting laser element has an emission region located above and within the span of a low dislocation density high conductance region having a dislocation density less than $1\times10^6$ cm$^{-2}$ and a carrier concentration of at least $1\times10^{18}$ cm$^{-3}$, the in-plane distribution of carriers flowing into the emission region is rendered uniform. Therefore, light emission in the emission region is rendered uniform and the light emitting efficiency is increased.

In the surface-emitting laser element of the present invention, the semiconductor layer side electrode can be formed at a location above and within the span of the low dislocation density high conductance region, such that the emission region is located above and within the span of the low dislocation density high conductance region. Further, a carrier narrow region can be formed in the group III-V compound semiconductor layer stack such that the emission region is located above and within the span of the low dislocation density high conductance region. Since such a surface-emitting laser element has the emission region located above and within the span of the low dislocation density high conductance region, the in-plane distribution of carriers flowing into the emission region is rendered uniform. Thus, light emission in the emission region is uniform.

In the surface-emitting laser element of the present invention, the conductive GaN substrate can further include at least one of a high dislocation density high conductance region having a dislocation density of at least $1\times10^6$ cm$^{-2}$ and a carrier concentration of at least $1\times10^{18}$ cm$^{-3}$, and a low dislocation density low conductance region having a dislocation density less than $1\times10^6$ cm$^{-2}$ and a carrier concentration less than $1\times10^{18}$ cm$^{-3}$. Since such a surface-emitting laser element has an emission region located above and within the span of a low dislocation density high conductance region that is a region having a dislocation density less than $1\times10^6$ cm$^{-2}$ and a carrier concentration of at least $1\times10^{18}$ cm$^{-3}$, the in-plane distribution of carriers flowing into the emission region is rendered uniform even if at least one of the high dislocation density high conductance region and low dislocation density low conductance region is present in the conductive GaN substrate. Thus, light emission in the emission region is rendered uniform, and the light emitting efficiency is increased.

In addition, the present invention is directed to a fabrication method of a surface-emitting laser array including a plurality of surface-emitting laser elements, and includes: a step of preparing a conductive GaN multiple-region substrate including a high dislocation density high conductance region having a high dislocation density and carrier concentration, a low dislocation density high conductance region having a dislocation density lower than the dislocation density of the high dislocation density high conductance region, and a low dislocation density low conductance region having a dislocation density and carrier concentration lower than the dislocation density and carrier concentration of the high dislocation density high conductance region, as a conductive GaN substrate; a semiconductor layer stack formation step of forming a group III-V compound semiconductor layer stack including an emission layer on one main surface of the conductive GaN multiple-region substrate; and an electrode formation step of forming a semiconductor layer side electrode on the uppermost layer of the group III-V compound semiconductor layer stack, and forming a substrate side electrode on an other main surface of the conductive GaN multiple-region substrate. The fabrication method of a surface-emitting laser array has the group III-V compound semiconductor layer stack, semiconductor layer side electrode, and substrate side electrode formed such that an emission region into which carriers flow in the emission layer of each surface-emitting laser element included in the surface-emitting laser array is limited to be located above and within the span of the low dislocation density high conductance region. According to such a fabrication method, a surface-emitting laser array including a plurality of surface-emitting laser elements having uniform light emission in the emission region by uniform in-plane distribution of carriers flowing into the emission region can be achieved with favorable yield.

In the electrode formation step of the fabrication method of the surface-emitting laser array of the present invention, the semiconductor layer side electrode can be formed at a location above and within the span of the low dislocation density high conductance region such that the emission region is limited to be located above and within the span of the low dislocation density high conductance region. Further, in the semiconductor layer stack formation step, a carrier narrow region can be formed in the group III-V compound semiconductor layer stack such that the emission region is limited to be located above and within the span of the low dislocation density high conductance region. By such a fabrication method, the emission region can be limited to be located above and within the span of the low dislocation density high conductance region. A surface-emitting laser array including a plurality of surface-emitting laser elements having uniform light emission in the emission region by carriers flowing uniformly into the emission region can be achieved readily with favorable yield.

In the fabrication method of a surface-emitting laser array of the present invention, the high dislocation density high conductance region is in dots. Each dot of the high dislocation density high conductance region is located on periodic triangular lattice points or square lattice points with $P_D$ as the lattice constant on the main surface of the conductive GaN multiple-region substrate. The low dislocation density high conductance region may be a region excluding each dot from a circle region having a radius $P_D/2$ about the center of each dot. Further, the high dislocation density high conductance region can be in stripes. Each stripe of the high dislocation density high conductance region is arranged at a periodic interval $P_S$ on the main surface of the conductive GaN multiple-region substrate. The low dislocation density high conductance region may be a region excluding, from the entire region of the GaN multiple-region substrate, each stripe and the low dislocation density low conductance region formed with the center located $P_S/2$ from the center of each stripe. According to such a fabrication method, a surface-emitting laser array including a plurality of surface-emitting laser elements having uniform light emission in the emission region by uniform in-plane distribution of carriers flowing into the emission region can be achieved with favorable yield.

In the fabrication method of a surface-emitting laser array of the present invention, the high dislocation density high conductance region is a region having a dislocation density of at least $1 \times 10^6$ cm$^{-2}$ and a carrier concentration of at least $1 \times 10^{18}$ cm$^{-3}$. The low dislocation density high conductance region is a region having a dislocation density less than $1 \times 10^6$ cm$^{-2}$ and a carrier concentration of at least $1 \times 10^{18}$ cm$^{-3}$. The low dislocation density low conductance region may be a region having a dislocation density less than $1 \times 10^6$ cm$^{-2}$ and a carrier concentration less than $1 \times 10^{18}$ cm$^{-3}$. By such a fabrication method, the emission region of each surface-emitting laser element can be limited to be located above and within the span of a low dislocation density high conductance region having a dislocation density less than $1 \times 10^6$ cm$^{-2}$ and a carrier concentration of at least $1 \times 10^{18}$ cm$^{-3}$. Thus, the in-plane distribution of carriers flowing into the emission region is rendered uniform. A surface-emitting laser array including a plurality of surface-emitting laser elements having uniform light emission in the emission region and high light emitting efficiency can be achieved with favorable yield.

The present invention is directed to a surface-emitting laser array including a plurality of surface-emitting laser elements. The surface-emitting laser element includes a conductive GaN substrate, a group III-V compound semiconductor layer stack having an emission layer formed on one main surface of the conductive GaN substrate, a semiconductor layer side electrode formed on an uppermost layer of the group III-V compound semiconductor layer stack, and a substrate side electrode formed on an other main surface of the conductive GaN substrate. The surface-emitting laser array includes a conductive GaN multiple-region substrate including a high dislocation density high conductance region having a high dislocation density and carrier concentration, a low dislocation density high conductance region having a dislocation density lower than that of the high dislocation density high conductance region, and a low dislocation density low conductance region having a dislocation density and carrier concentration lower than those of the high dislocation density high conductance region. In the surface-emitting laser array, the emission region into which carriers flow in the emission layer of each surface-emitting laser element included in the surface-emitting laser array is located above and within the span of the low dislocation density high conductance region. Since the surface-emitting laser array has the emission region of each surface-emitting laser element located above and within the span of the low dislocation density high conductance region, the in-plane distribution of carriers flowing into the emission region is rendered uniform, allowing uniform light emission in the emission region.

In the surface-emitting laser array of the present invention, the semiconductor layer side electrode can be formed at a location above and within the span of the low dislocation density high conductance region, such that the emission region is located above and within the span of the low dislocation density high conductance region. Further, a carrier narrow region can be formed in the group III-V compound semiconductor layer stack such that the emission region is located above and within the span of the low dislocation density high conductance region. Since such a surface-emitting laser array has the emission region of each surface-emitting laser element located above and within the span of the low dislocation density high conductance region, the in-plane distribution of carriers flowing into the emission region is rendered uniform. Thus, light emission in the emission region is uniform.

In the surface-emitting laser array of the present invention, the high dislocation density high conductance region has a dislocation density of at least $1 \times 10^6$ cm$^{-2}$ and a carrier concentration of at least $1 \times 10^{18}$ cm$^{-3}$. The low dislocation density high conductance region has a dislocation density less than $1 \times 10^6$ cm$^{-2}$ and a carrier concentration of at least $1 \times 10^{18}$ cm$^{-3}$. The low dislocation density low conductance region has a dislocation density less than $1 \times 10^6$ cm$^{-2}$ and a carrier concentration less than $1 \times 10^{18}$ cm$^{-3}$. Since the surface-emitting laser array has the emission region of each surface-emitting laser element located above and within the span of a low dislocation density high conductance region having a dislocation density less than $1 \times 10^6$ cm$^{-2}$ and a carrier concentration of at least $1 \times 10^{18}$ cm$^{-3}$, the in-plane distribution of carriers flowing into the emission region is rendered uniform. Thus, light emission in the emission region is rendered uniform, and the light emitting efficiency is increased.

Effects of the Invention

According to the present invention, a surface-emitting laser element and surface-emitting laser array having uniform light emission in the emission region and fabrication methods of fabricating the same with favorable yield can be provided.

DESCRIPTION OF THE REFERENCE CHARACTERS

Figure 1A:
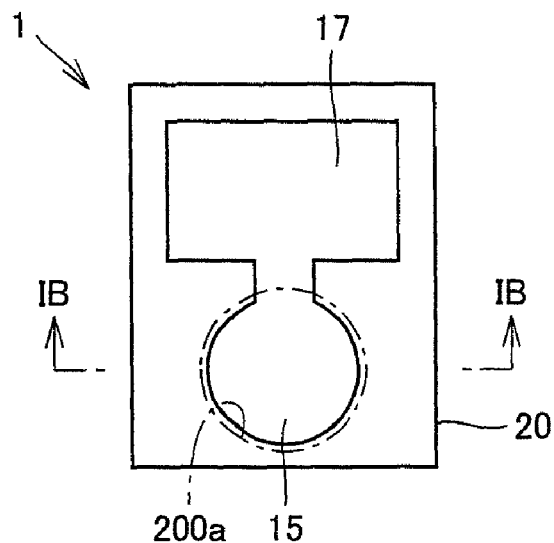
FIG. 1A is a schematic plan view of an example of a surface-emitting laser element according to the prevent invention.

1 surface-emitting laser element; 2 surface-emitting laser array; 10 conductive GaN substrate; 10a high dislocation density high conductance region; 10b low dislocation density high conductance region; 10c low dislocation density low conductance region; 10m, 10n, 233m main surface; 11 substrate side electrode; 15 semiconductor layer side electrode; 17 pad electrode; 20 group III-V compound semiconductor layer stack; 21 first stack; 22 second stack; 30 resist; 40 underlying substrate; 41 peeling layer; 70 bonding wire; 103 dielectric mirror; 200 emission layer; 200a emission region; 201 buffer layer: 210, 220 group III-V compound semiconductor layer; 213, 223 DBR; 215, 225, 226 clad layer; 227, 229 contact layer; 233 photonic crystal layer; 233a crystal layer; 233b diffraction grating hole; 250 carrier narrow region; 250a carrier narrow layer; 250b insulative region.

BEST MODES FOR CARRYING OUT THE INVENTION

The best modes for carrying out the present invention will be described with reference to the drawings. It is to be noted that FIGS. 1B, 2B, 6B, 7B, 8B, 10-15, 17B and 18B representing schematic sectional views of a surface-emitting laser element or surface-emitting laser array do not reflect the actual thickness of the conductive GaN substrate and each layer in the group III-V compound semiconductor layer stack. The thickness of each layer may be illustrated with exaggeration in order to clarify the layer structure of the group III-V compound semiconductor layer stack.

First Embodiment

Referring to FIGS. 1A, 1B, 2A and 2B, a fabrication method of a surface-emitting laser element according to the present invention includes a step of preparing a conductive GaN multiple-region substrate including a high dislocation density high conductance region 10a having a high dislocation density and carrier concentration, a low dislocation density high conductance region 10b having a dislocation density lower than that of high dislocation density high conductance region 10a, and a low dislocation density low conductance region 10c having a dislocation density and carrier concentration lower than those of high dislocation density high conductance region 10a, as a conductive GaN substrate 10; a semiconductor layer stack formation step of forming a group III-V compound semiconductor layer stack 20 including an emission layer 200 on one main surface 10m of the conductive GaN multiple-region substrate; and an electrode formation step of forming a semiconductor layer side electrode 15 on the uppermost layer of group III-V compound semiconductor layer stack 20, and forming a substrate side electrode 11 on the other main surface 10n of the conductive GaN multiple-region substrate. Group III-V compound semiconductor layer stack 20, semiconductor layer side electrode 15, and substrate side electrode 11 are formed such that an emission region 200a into which carriers flow in emission layer 200 is limited to be located above and within the span of low dislocation density high conductance region 10b.

In the fabrication method of a surface-emitting laser element according to the present embodiment, group III-V compound semiconductor layer stack 20, semiconductor layer side electrode 15, and substrate side electrode 11 are formed such that emission region 200a into which carriers flow in emission layer 200 is limited to be located above and within the span of low dislocation density high conductance region 10b. Accordingly, carriers flow uniformly in emission region 200a. Thus, a surface-emitting laser element 1 having uniform light emission in emission region 200a can be obtained.

Figure 1B:
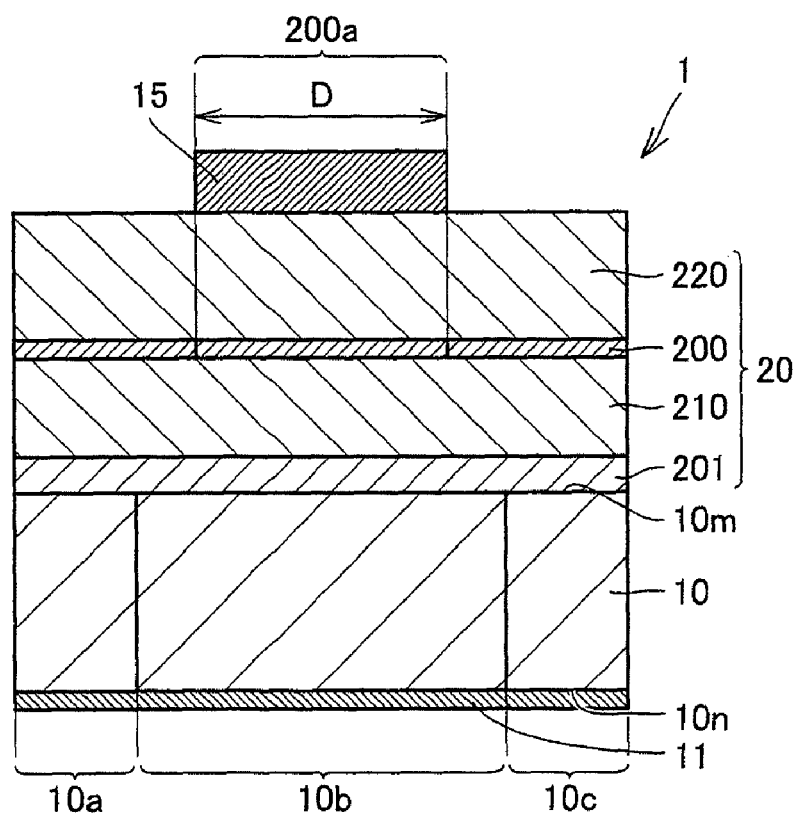
FIG. 1B is a schematic sectional view taken along line IB-IB of FIG. 1A.
Figure 2A:
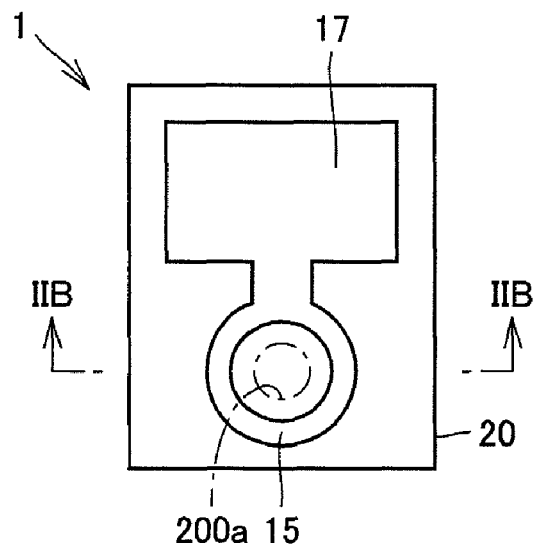
FIG. 2A is a schematic plan view of another example of a surface-emitting laser element according to the present invention.
Figure 2B:
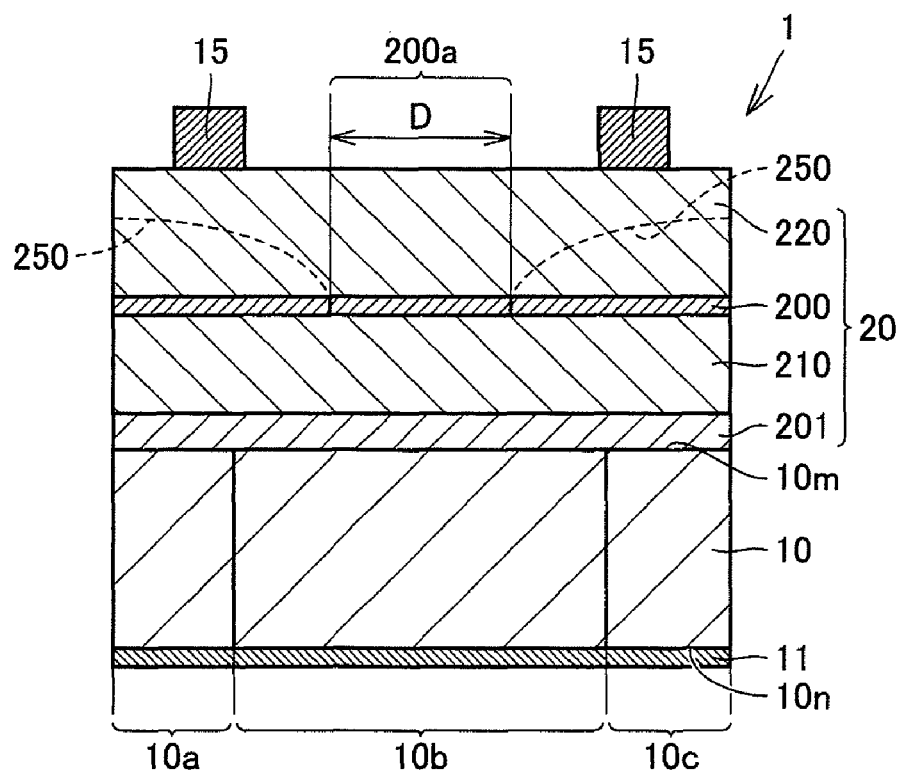
FIG. 2B is a schematic sectional view taken along line IIB-IIB of FIG. 2A.

The method of forming group III-V compound semiconductor layer stack 20, semiconductor layer side electrode 15, and substrate side electrode 11 such that emission region 200a into which carriers flow in emission layer 200 is limited to be located above and within the span of low dislocation density high conductance region 10b is not particularly limited. For example, such methods include the method of forming semiconductor layer side electrode 15 to be located above and within the span of low dislocation density high conductance region 10b, as shown in FIGS. 1A and 1B, the method of forming a carrier narrow region 250 in group III-V compound semiconductor layer stack 20, as shown in FIGS. 2A and 2B, and the like. Details will be described afterwards. For the resonator configuration to cause oscillation of light emission from emission region 200a from the main surface of the element, various structures that will be described afterwards can be employed. Such a resonator structure is not illustrated in FIGS. 1A, 1B, 2A and 2B.

Referring to FIGS. 3A, 3B, 4A, 4B, 5A and 5B, the fabrication method of a surface-emitting laser element according to the first embodiment includes the step of preparing a conductive GaN multiple-region substrate including, as conductive GaN substrate 10, a high dislocation density high conductance region 10a having a high dislocation density and carrier concentration, a low dislocation density high conductance region 10b having a dislocation density lower than that of the high dislocation density high conductance region, and a low dislocation density low conductance region 10c having a dislocation density and carrier concentration lower than those of the high dislocation density high conductance region. As used herein, the dislocation density of each region can be obtained by directly counting the number of scotoma in the fluorescent image per unit area based on the CL (Cathode Luminescence) scheme or the number of etch pitch per unit area based on the etch pitch measurement. Further, the carrier concentration in each region can be measured by the C-V (capacitance-voltage measurement) or Hall measurement method. Carriers are the generic designation of holes or electrons contributing to conductance, and carrier concentration refers to the concentration of holes or electrons contributing to conductance. By concentrating the dislocations at high dislocation density high conductance region 10a in the conductive GaN multiple-region substrate, the dislocation density in regions other than high dislocation density high conductance region 10a (that is, low dislocation density high conductance region 10b and low dislocation density low conductance region 10c) is reduced. Therefore, a group III-V compound semiconductor layer stack having a low dislocation density can be formed on low dislocation density high conductance region 10b and low dislocation density low conductance region 10c. Thus, a surface-emitting laser element of high light emission intensity and reliability can be obtained.

For example, the lifetime of an FP (Fabry-Perot) type (a typical edge-emitting type) laser element having an emission region 200a in emission layer 200 located above and within the span of high dislocation density high conductance region 10a of the conductive GaN multiple-region substrate set forth above is approximately 100 hours to 1000 hours, whereas the lifetime of an FP type laser element having emission region 200a of emission layer 200 located above and within the span of a region other than high dislocation density high conductance region 10a (that is, low dislocation density high conductance region 10b and low dislocation density low conductance region 10c) is 50,000 hours or more, which is extremely longer.

The fabrication method of a conductive GaN multiple-region substrate employed in the present embodiment is not particularly limited. For example, a seed can be prepared in advance at the site where a high dislocation density high conductance region is to be formed during the crystal-growth of GaN on the underlying substrate. A specific fabrication method of such a conductive GaN multiple-region substrate will be described hereinafter.

First, an underlying substrate is prepared. The underlying substrate is not particularly limited, as long as GaN can be crystal-grown. A sapphire substrate, a GaAs substrate and the like can be enumerated. In consideration of removing the underlying substrate at a subsequent step, a GaAs substrate or the like that can be readily removed is preferable.

Then, a seed such as of an $SiO_2$ film, for example, is formed on the underlying substrate. This seed can be provided in the form of dots, or stripes, for example. A plurality of such seeds can be formed with regularity. Specifically, the seeds are arranged in dots or stripes corresponding to the arrangement of high dislocation density high conductance region 10a in FIG. 3A, 4A or 5A.

On the underlying substrate having the seed set forth above formed, a GaN crystal is grown by, for example, HVPE (Hydride Vapor Phase Epitaxy). A facet corresponding to the pattern shape of the seed is formed on the GaN crystal-growing face during or subsequent to crystal growth. In the case where the seed is provided in a dot pattern, a pit formed of facets is formed with regularity. In the case where the seed is provided in a stripe pattern, facets corresponding to a prism are formed. By adding a dopant to the GaN raw material in the crystal growing step, the GaN crystal is rendered conductive.

The grown GaN crystal is cut out in a predetermined configuration. By polishing the surface thereof, a conductive GaN multiple-region substrate (conductive GaN substrate 10) including high dislocation density high conductance region 10a, low dislocation density high conductance region 10b and low dislocation density low conductance region 10c is obtained.

Figure 3A:
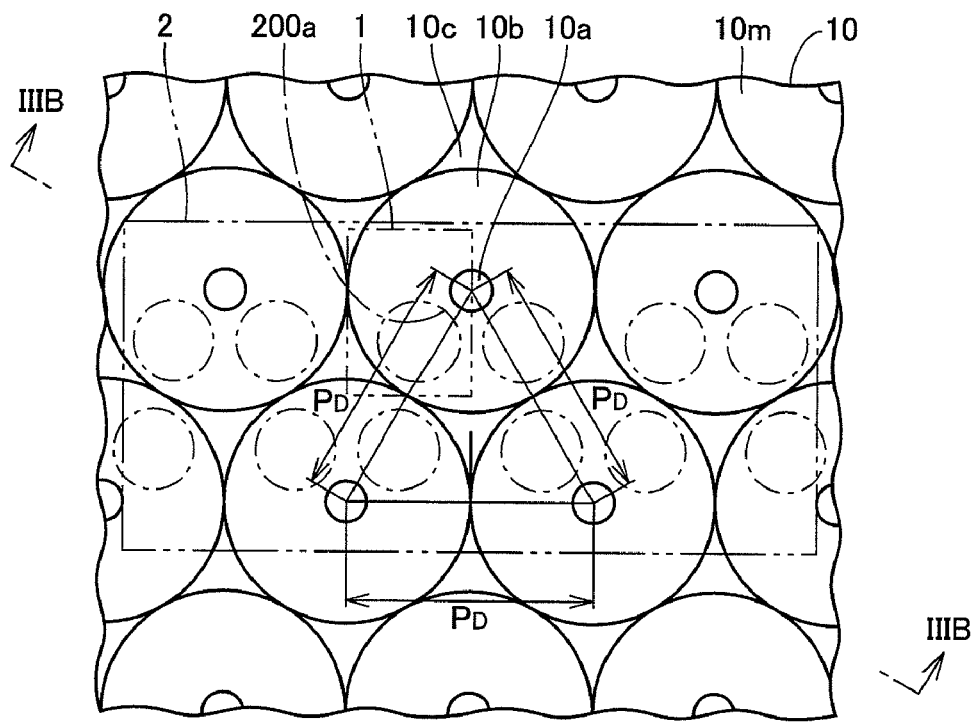
FIG. 3A is a schematic plan view of a specific example of a conductive GaN substrate employed in the present invention.
Figure 3B:
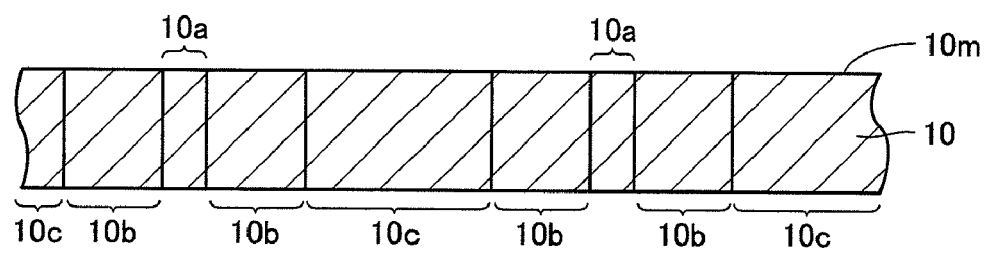
FIG. 3B is a schematic sectional view taken along line IIIB-IIIB of FIG. 3A.
Figure 4A:
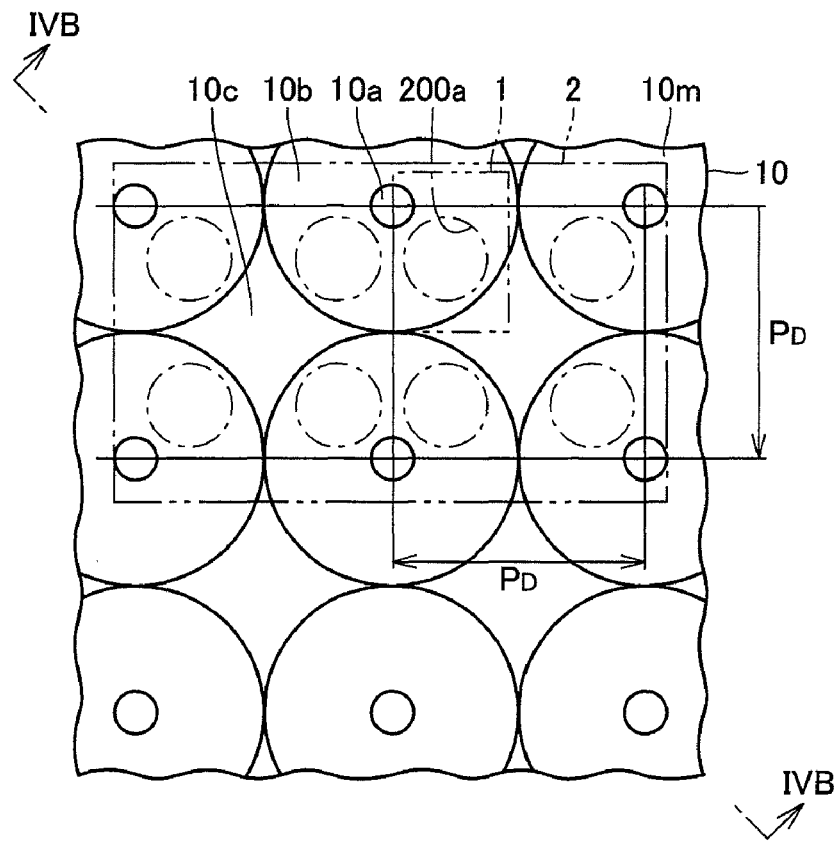
FIG. 4A is a schematic plan view of another specific example of a conductive GaN substrate employed in the present invention.
Figure 4B:
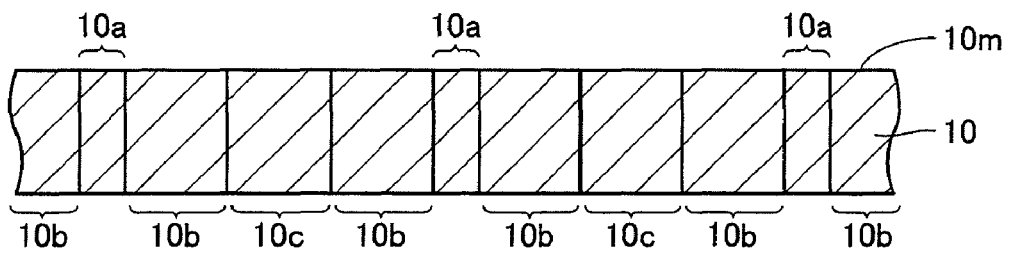
FIG. 4B is a schematic sectional view taken along line IVB-IVB of FIG. 4A.
Figure 5A:
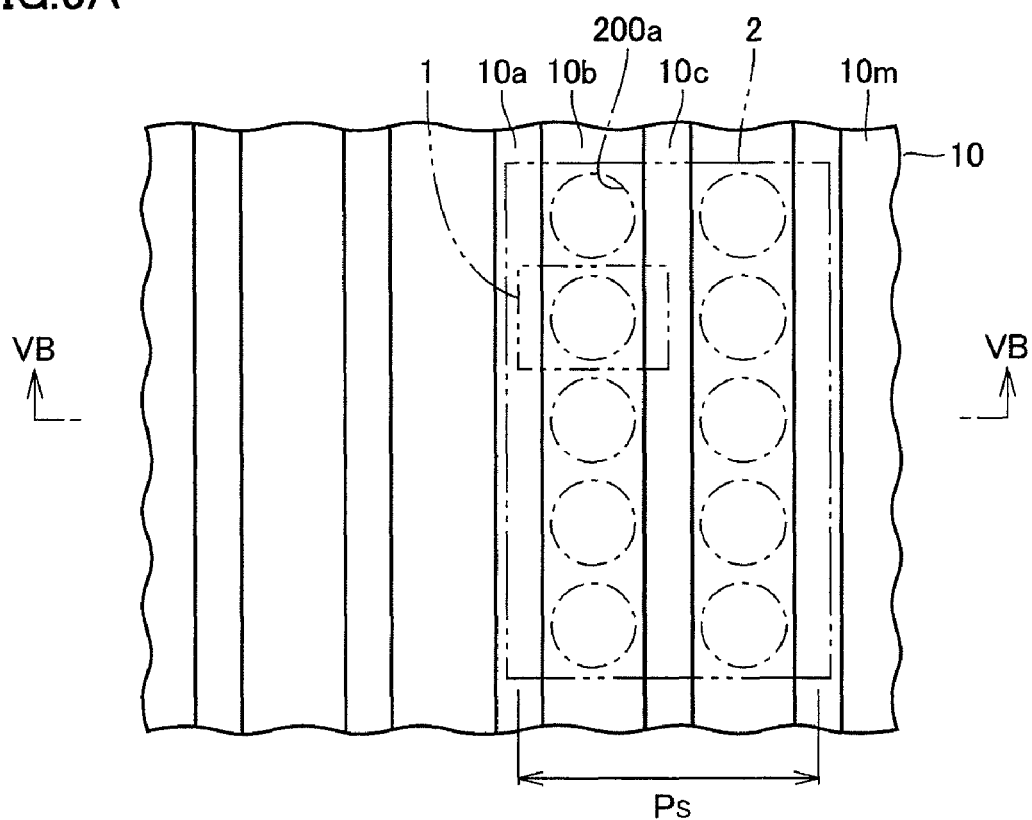
FIG. 5A is a schematic plan view of a further specific example of a conductive GaN substrate employed in the present invention.

Referring to FIGS. 3A, 3B, 4A, 4B, 5A and 5B, high dislocation density high conductance region 10a corresponding to the arrangement of the seed of the underlying substrate is formed at the conductive GaN multiple-region substrate (conductive GaN substrate 10). Low dislocation density high conductance region 10b is formed within a predetermined range from high dislocation density high conductance region 10a. Referring to FIG. 3A or 4A, in the case where high dislocation density high conductance region 10a is formed in dots, a doughnut-shaped low dislocation density high conductance region 10b is formed. Referring to FIG. 5A, in the case where high dislocation density high conductance region 10a is formed in stripes, low dislocation density high conductance region 10b is formed in stripes. Further, low dislocation density low conductance region 10c is formed between a low dislocation density high conductance region 10b and an adjacent low dislocation density high conductance region 10b. High dislocation density high conductance region 10a, low dislocation density high conductance region 10b and low dislocation density low conductance region 10c can be observed by means of a fluorescent microscope.

Thus, a conductive GaN multiple-region substrate including a high dislocation density high conductance region 10a having a dislocation density of at least $1 \times 10^6$ cm$^{-2}$ and a carrier concentration of at least $1 \times 10^{18}$ cm$^{-3}$, a low dislocation density high conductance region 10b having a dislocation density less than $1\times10^6$ cm$^{-2}$ and a carrier concentration of at least $1\times10^{18}$ cm$^{-3}$, and a low dislocation density low conductance region 10c having a dislocation density less than $1\times10^6$ cm$^{-2}$ and a carrier concentration less than $1\times10^{18}$ cm$^{-3}$ is obtained.

Figure 19:
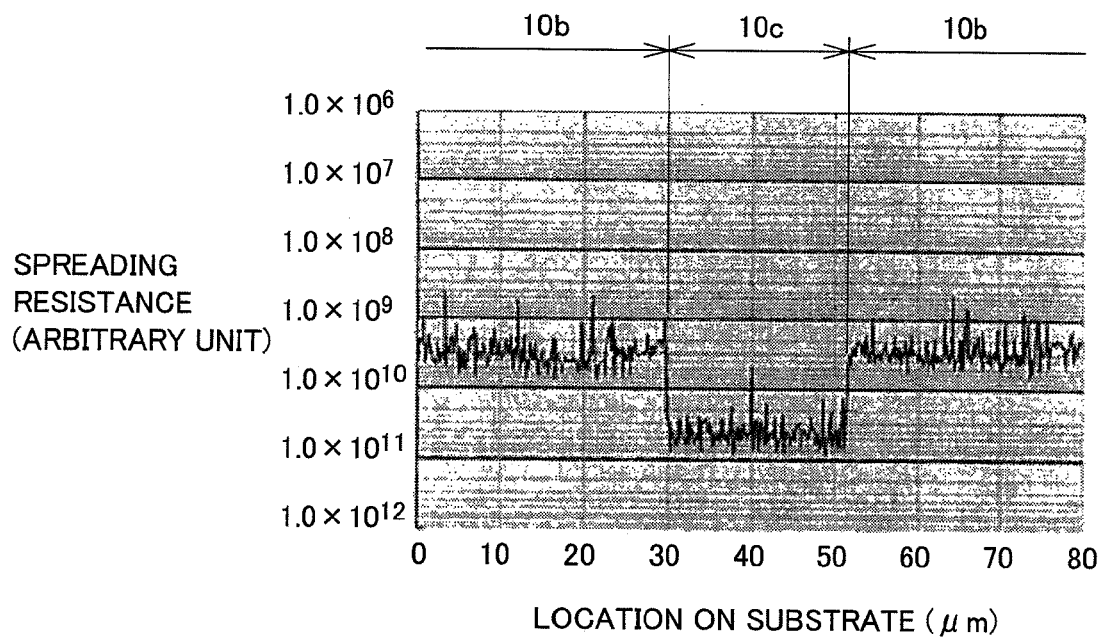
FIG. 19 is a diagram representing the spreading resistance of the low dislocation density high conductance region and low dislocation density low conductance region of a conductive GaN substrate.

With regards to the resistivity of each region in the conductive GaN multiple-region substrate set forth above, the resistivity of high dislocation density high conductance region 10a and low dislocation density high conductance region 10b was 0.002 Ω·cm to 0.1 Ω·cm, and the resistivity of low dislocation density low conductance region 10c was 0.5 Ω·cm to 100000 Ω·cm. A discontinuous change in resistivity was observed at the boundary between low dislocation density high conductance region 10b and low dislocation density low conductance region 10c. Referring to FIG. 19, the value of the spreading resistance of low dislocation density high conductance region 10b and low dislocation density low conductance region 10c at the conductive GaN multiple-region substrate set forth above was measured by SSRM (Scanning Spread Resistance Microscope). It was confirmed that the difference between the values thereof were at least one order of magnitude.

Referring to FIGS. 1A, 1B, 2A and 2B, the fabrication method of a surface-emitting laser element of the first embodiment includes the step of forming a group III-V compound semiconductor layer stack 20 including emission layer 200 on one main surface 10m of the conductive GaN multiple-region substrate (conductive GaN substrate 10). As used herein, a group III-V compound semiconductor layer refers to a semiconductor layer formed by a compound of group IIIb element and nitrogen that is group Vb element in the long periodic table. A group III-V compound semiconductor layer stack refers to a stack of III-V compound semiconductor layers.

The stack structure of group III-V compound semiconductor layer stack 20 in the first embodiment is not particularly limited, as long as the structure suits the object of the present invention. An example of formation thereof will be described hereinafter with reference to FIGS. 1A, 1B, 2A, and 2B. On conductive GaN substrate 10, a first conductivity type group III-V compound semiconductor layer 210 of at least one layer, emission layer 200, and a second conductivity type group III-V compound semiconductor layer 220 of at least one layer are formed. A buffer layer 201 may be formed between conductive GaN substrate 10 and first conductivity type group III-V compound semiconductor layer 210. As used herein, a group III-V compound semiconductor layer refers to a semiconductor layer formed by a compound of group IIIb element and nitrogen that is a group Vb element in the long periodic table. The first conductivity type and the second conductivity type refer to conductivity types different from each other, such as n type and p type, or p type and n type. The stack structure of III-V compound semiconductor layer 20 includes a resonator structure to cause oscillation of light emission from emission region 200a from the main surface of the element, as will be described afterwards (not shown in FIGS. 1 and 2).

Referring to FIGS. 1A, 1B, 2A and 2B, the fabrication method of a surface-emitting laser element of the first embodiment includes an electrode formation step of forming a semiconductor layer side electrode 15 on the uppermost layer of group III-V compound semiconductor layer stack 20, and a substrate side electrode 11 on the other main surface 10n of the conductive GaN multiple-region substrate (conductive GaN substrate 10). By forming such electrodes, a surface-emitting laser element is obtained. Referring to FIGS. 1A and 2A, a pad electrode 17 is formed in electrical connection with semiconductor layer side electrode 15. This pad electrode 17 serves to electrically connect a bonding wire.

In the fabrication method of a surface-emitting laser element of the first embodiment, group III-V compound semiconductor layer stack 20, semiconductor layer side electrode 15 and substrate side electrode 11 are formed such that emission region 200a into which carriers flow in emission layer 200 is limited to be located above and within the span of low dislocation density high conductance region 10b. Although not particularly limited, the method of forming group III-V compound semiconductor layer stack 20, semiconductor layer side electrode 15 and substrate side electrode 11 preferably employs the method set forth below.

First Embodiment-A1

Referring to FIGS. 1A and 1B, in the electrode formation step in the fabrication method of a surface-emitting laser element of the first embodiment, semiconductor layer side electrode 15 can be formed at a location above and within the span of low dislocation density high conductance region 10b, such that emission region 200a is limited to be located above and within the span of low dislocation density high conductance region 10b. According to the first embodiment-A1, even if substrate side electrode 11 is formed spreading as far as below high dislocation density high conductance region 10a or low dislocation density low conductance region 10c in addition to below low dislocation density high conductance region 10b, formation of semiconductor layer side electrode 15 at a location above and within the span of low dislocation density high conductance region 10b allows emission region 200a into which carriers flow in emission layer 200 to be limited to a location above and within the span of low dislocation density high conductance region 10b. Therefore, the carriers flow uniformly into emission region 200a. Thus, a surface-emitting laser element having uniform light emission in emission region 200a can be obtained.

Referring to FIGS. 1A and 1B, in the case where the semiconductor layer side electrode is not transparent in the surface-emitting laser element of the first embodiment-A1, light emission in emission region 200a (diameter D) will be externally provided only from the main surface of the region in proximity to the outer circumference of semiconductor layer side electrode 15 (referring to the outer side region up to approximately 5 μm from the outer circumference, the same applies hereinafter). By providing at least one opening (not shown) in semiconductor layer side electrode 15, light emission in emission region 200a can be output through the opening. Further, by employing a transparent electrode for semiconductor layer side electrode 15, light emission of emission region 200a can be externally provided from the entire region of semiconductor layer side electrode 15. Although it is apparent from FIG. 1B that emission region 200a of emission layer 200 substantially matches the formation region of semiconductor layer side electrode 15, the boundary line is displaced to aid visuality in FIG. 1A.

First Embodiment-A2

Referring to FIGS. 2A and 2B, in the semiconductor formation step in the fabrication method of the surface-emitting laser element of the first embodiment, a carrier narrow region 250 can be formed in group III-V compound semiconductor layer stack 20 such that emission region 200a is limited to be located above and within the span of low dislocation density high conductance region 10b. According to the first embodiment 1-A2, even if semiconductor layer side electrode 15 and substrate side electrode 11 are formed spreading as far as above or below high dislocation density high conductance region 10a or low dislocation density low conductance region 10c in addition to above or below low dislocation density high conductance region 10b, formation of carrier narrow region 250 in group III-V compound semiconductor layer stack 20 allows emission region 200a into which carriers flow in emission layer 200 to be limited to a location above and within the span of low dislocation density high conductance region 10b. Therefore, carriers flow uniformly into emission region 200a. Thus, a surface-emitting laser element having uniform light emission in emission region 200a can be obtained.

Figure 6A:
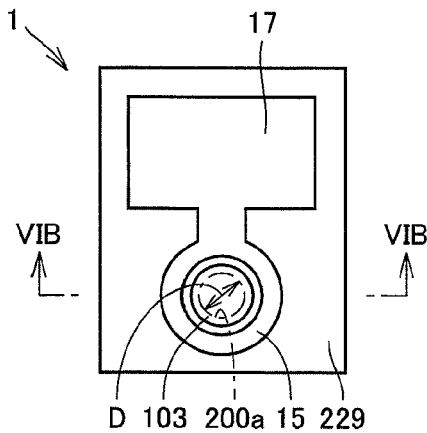
FIG. 6A is a schematic plan view of a specific example of a surface-emitting laser element according to the present invention.
Figure 6B:
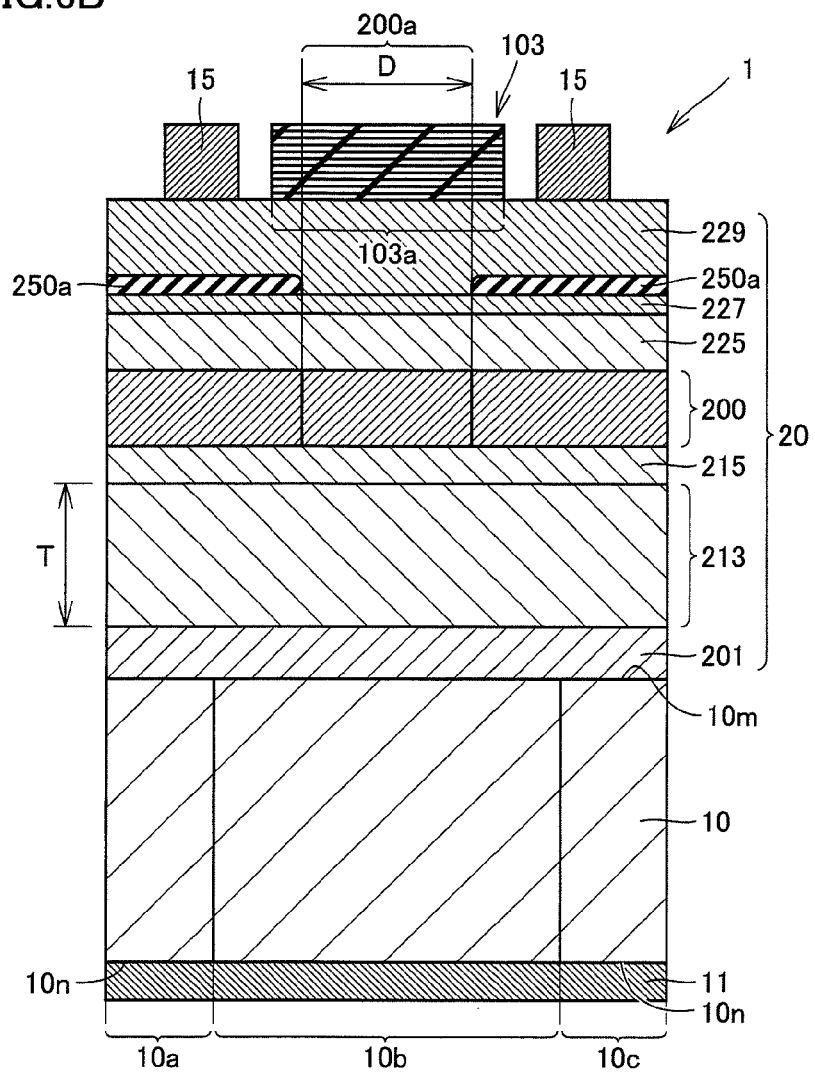
FIG. 6B is a schematic sectional view taken along line VIB-VIB of FIG. 6A.

The method of forming carrier narrow region 250 is not particularly limited, as long as the method suits the object of the present invention. For example, in the case where the region is partitioned in a mesa shape by mesa etching, for example, some of the carriers flowing in will be recombined by the etching damage at the mesa side plane. From the standpoint of preventing such carrier recombination, the method of forming a carrier narrow layer 250a from an insulator, as shown in FIG. 6B, the method of forming an insulative region 250b that has been rendered insulative by ion implantation, as shown in FIG. 7B, or the like can be cited.

Referring to FIGS. 2A and 2B, an annular electrode having an opening at the center area is formed as semiconductor layer side electrode 15. Since emission region 200a is limited to be located within the span of the opening of annular semiconductor layer side electrode 15 by the presence of carrier narrow region 250, the light emitted from emission region 200a is externally output from the opening region of annular semiconductor layer side electrode 15.

With regards to the method of limiting emission region 200a into which carriers flow in emission layer 200 to be located above and within the span of low dislocation density high conductance region 10b, there has been described the method of forming semiconductor layer side electrode 15 at a location above and within the span of low dislocation density high conductance region 10b in the first embodiment-A1, and the method of forming carrier narrow region 250 in group III-V compound semiconductor layer stack 20 in the first embodiment-A2. Preferably, the method of forming carrier narrow region 250 in group III-V compound semiconductor layer stack 20, and forming semiconductor layer side electrode 15 at a location above and within the span of low dislocation density high conductance region 10b is employed.

Figure 7A:
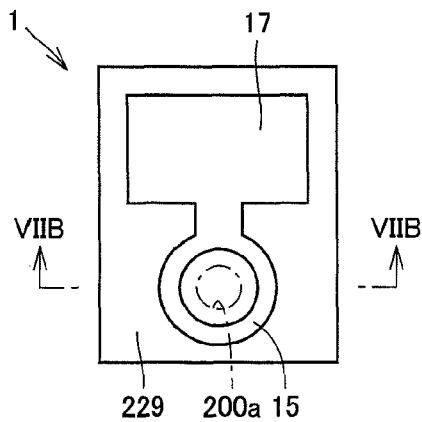
FIG. 7A is a schematic plan view of another specific example of a surface-emitting laser element according to the present invention.
Figure 7B:
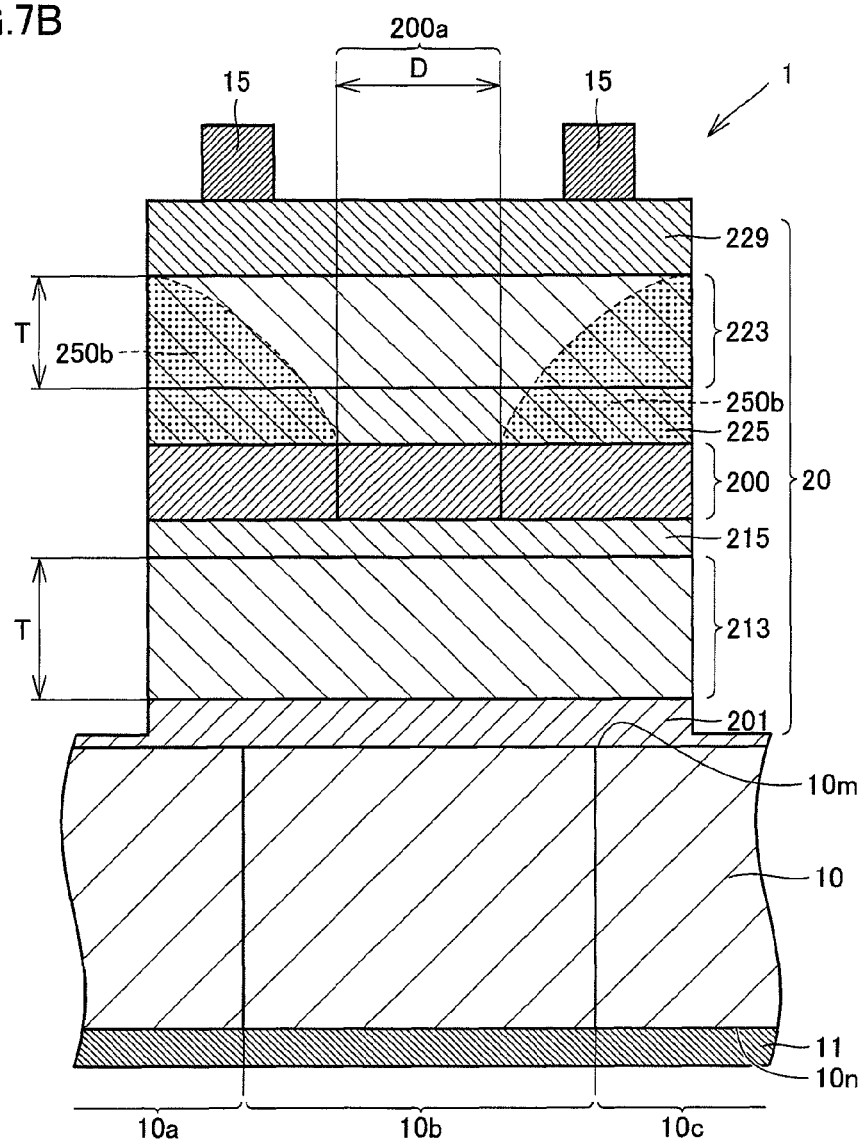
FIG. 7B is a schematic sectional view taken along line VIIB-VIIB of FIG. 7A.
Figure 8A:
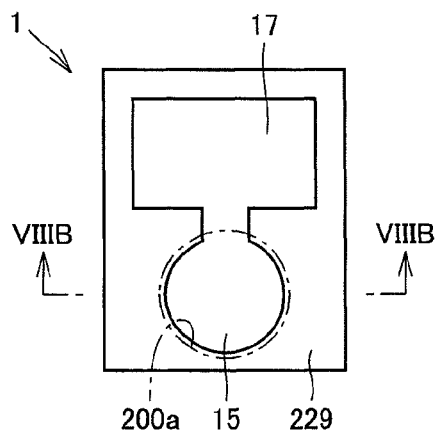
FIG. 8A is a schematic plan view of a further specific example of a surface-emitting laser element according to the present invention.
Figure 8B:
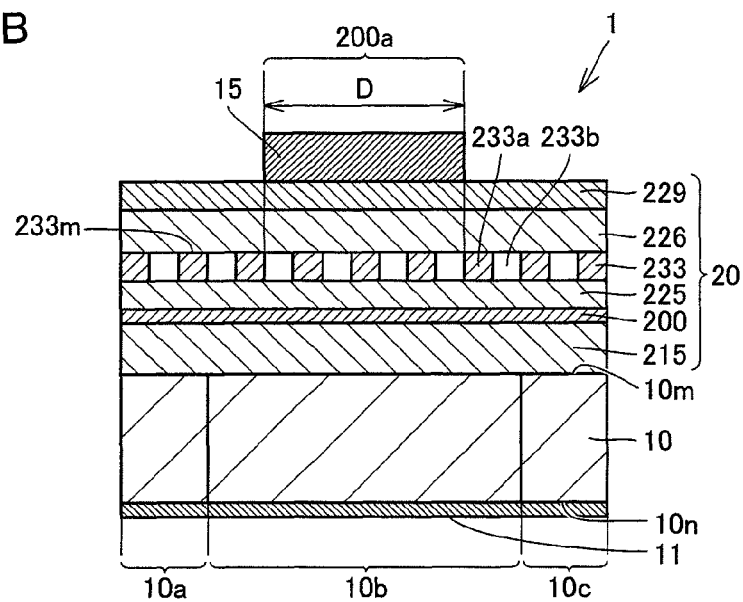
FIG. 8B is a schematic sectional view taken along line VIIIB-VIIIB of FIG. 8A.

Although the stack structure of group III-V compound semiconductor layer stack 20 that allows surface emission is not particularly limited in the surface-emitting element obtained by the fabrication method of the surface-emitting laser element of the first embodiment, a combined structure of an n type layer side DBR (multilayer distributed Bragg reflector; the same applies hereinafter) 213 and a dielectric mirror 103 shown in FIG. 6B, a combined structure of an n type layer side DBR 213 and p type layer side DBR 223, as shown in FIG. 7B, a structure including a photonic crystal layer 233, as shown in FIG. 8B, and the like are preferably cited.

In the fabrication method of a surface-emitting laser element of the first embodiment, arrangement of low dislocation density high conductance region 10b on main surfaces 10m and 10n of the conductive GaN multiple-region substrate (conductive GaN substrate 10) is critical from the standpoint of forming emission region 200a at a location above and within the span of low dislocation density high conductance region 10b of the conductive GaN multiple-region substrate (conductive GaN substrate 10). This issue will be described specifically hereinafter.

First Embodiment-B1

Referring to FIGS. 3A and 3B as well as FIGS. 4A and 4B, in the conductive GaN multiple-region substrate (conductive GaN substrate 10) employed in the fabrication method of a surface-emitting laser element of the first embodiment, high dislocation density high conductance region 10a is formed in dots. Each dot of high dislocation density high conductance region 10a is arranged on periodic triangular lattice points (in the case of FIG. 3A) or square lattice points (in the case of FIG. 4A) with $P_D$ as the lattice constant on main surfaces 10m and 10n of the conductive GaN multiple-region substrate (conductive GaN substrate 10). Low dislocation density high conductance region 10b corresponds to a doughnut-like region excluding respective dots from a circle region with a radius $P_D/2$ about the center of each dot. The outer perimeter of high dislocation density high conductance region 10a and low dislocation density high conductance region 10b actually takes a polygonal form close to a circle, and approximates a circle as shown in FIG. 3A or 4A. By forming emission region 200a to be located above and within the span of low dislocation density high conductance region 10b identified as set forth above, the in-plane distribution of carriers flowing into an emission region 200a is rendered uniform. A surface-emitting laser element having uniform light emission in emission region 200a can be readily obtained with favorable yield.

First Embodiment-B2

Figure 5B:
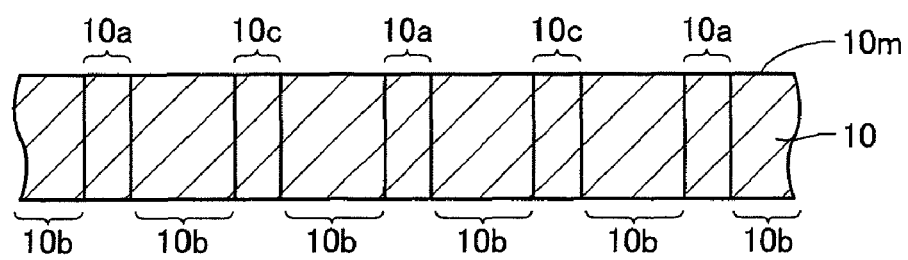
FIG. 5B is a schematic sectional view taken along line VB-VB of FIG. 5A.

Referring to FIGS. 5A and 5B, in the conductive GaN multiple-region substrate (conductive GaN substrate 10) employed in the fabrication method of surface-emitting laser element of the first embodiment, high dislocation density high conductance region 10a is formed in stripes. Each stripe of high dislocation density high conductance region 10a is arranged at a periodic interval $P_S$ on main surfaces 10m and 10n of the conductive GaN multiple-region substrate. Low dislocation density high conductance region 10b is equal to a region excluding each stripe and low dislocation density low conductance region 10c formed with the center located $P_S/2$ from the center of each stripe from the entire region of the conductive GaN multiple-region substrate (conductive GaN substrate 10). By forming emission region 200a to be located above and within the span of low dislocation density high conductance region 10b identified as set forth above, the in-plane distribution of carriers flowing into emission region 200a is rendered uniform. A surface-emitting laser element having uniform light emission in emission region 200a can be readily achieved with favorable yield.

First Embodiment-C

In the conductive GaN multiple-region substrate (conductive GaN substrate 10) employed in the fabrication method of a surface-emitting laser element of the first embodiment, preferably high dislocation density high conductance region 10a is a region having a dislocation density of at least $1 \times 10^6$ cm$^{-2}$ and a carrier concentration of at least $1 \times 10^{18}$ cm$^{-3}$; low dislocation density high conductance region 10b is a region having a dislocation density less than $1 \times 10^6$ cm$^{-2}$ and a carrier concentration of at least $1 \times 10^{18}$ cm$^{-3}$; and the low dislocation density low conductance region 10c is a region having a dislocation density less than $1 \times 10^6$ cm$^{-2}$ and a carrier concentration less than $1 \times 10^{18}$ cm$^{-3}$. By forming an emission region 200a at a location above and within the span of low dislocation density high conductance region 10b having a dislocation density less than $1 \times 10^6$ cm$^{-2}$ and a carrier concentration of at least $1\times10^{18}$ cm$^{-3}$ using the conductive GaN multiple-region substrate, the in-plane distribution of carriers into which current flows uniformly into emission region is rendered uniform. Thus, a surface-emitting laser element having uniform light emission in the emission region and of high light emitting efficiency can be obtained with favorable yield.

Second Embodiment

Referring to FIGS. 1A, 1B, 2A and 2B, a surface-emitting laser element of the present invention is directed to a surface-emitting laser element 1 including a conductive GaN substrate 10, a group III-V compound semiconductor layer stack 20 including an emission layer 200 formed on one main surface 10*m* of conductive GaN substrate 10, a semiconductor layer side electrode 15 formed on the uppermost layer of group III-V compound semiconductor layer stack 20, and a substrate side electrode 11 formed on the other main surface 10*n* of conductive GaN substrate 10. Conductive GaN substrate 10 includes a low dislocation density high conductance region 10*b* that is a region having a dislocation density less than $1\times10^{6}$ cm$^{-2}$ and a carrier concentration of at least $1\times10^{18}$ cm$^{-3}$. An emission region 200*a* into which carriers flow in emission layer 200 is located above and within the span of low dislocation density high conductance region 10*b*. Since surface-emitting laser element 1 has emission region 200*a* located above and within the span of low dislocation density high conductance region 10*b* that is a region having a dislocation density less than $1\times10^{6}$ cm$^{-2}$ and a carrier concentration of at least $1\times10^{18}$ cm$^{-3}$, the in-plane distribution of carriers flowing into emission region 200*a* is uniform. Light emitted in emission region 200*a* is uniform and the light emitting efficiency is increased.

Second Embodiment-A1

Referring to FIGS. 1A and 1B, an example of a surface-emitting laser element according to the second embodiment is directed to a surface-emitting laser element 1 including a conductive GaN substrate 10, a group III-V compound semiconductor layer stack 20 including an emission layer 200 formed on one main surface 10*m* of conductive GaN substrate 10, a semiconductor layer side electrode 15 formed on the uppermost layer of group III-V compound semiconductor layer stack 20, and a substrate side electrode 11 formed on the other main surface 10*n* of conductive GaN substrate 10. Conductive GaN substrate 10 includes a low dislocation density high conductance region 10*b* that is a region having a dislocation density less than $1\times10^{6}$ cm$^{-2}$ and a carrier concentration of at least $1\times10^{18}$ cm$^{-3}$. Semiconductor layer side electrode 15 is formed at a location above and within the span of low dislocation density high conductance region 10*b* such that emission region 200*a* into which carriers flow in emission layer 200 is located above and within the span of low dislocation density high conductance region 10*b*. Since surface-emitting laser element 1 has emission region 200*a* located above and within the span of low dislocation density high conductance region 10*b* that is a region having a dislocation density less than $1\times10^{6}$ cm$^{-2}$ and a carrier concentration of at least $1\times10^{18}$ cm$^{-3}$, the in-plane distribution of carriers flowing into emission region 200*a* is uniform. The light emitted in emission region 200*a* is uniform, and the light emitting efficiency is improved.

Second Embodiment-A2

Referring to FIGS. 2A and 2B, another example of a surface-emitting laser element according to the second embodiment is directed to a surface-emitting laser element including a conductive GaN substrate 10, a group III-V compound semiconductor layer stack 20 including an emission layer 200 formed on one main surface 10*m* of conductive GaN substrate 10, a semiconductor layer side electrode 15 formed on the uppermost layer of group III-V compound semiconductor layer stack 20, and a substrate side electrode 11 formed on the other main surface 10*n* of conductive GaN substrate 10. Conductive GaN substrate 10 includes a low dislocation density high conductance region that is a region having a dislocation density less than $1\times10^{6}$ cm$^{-2}$ and a carrier concentration of at least $1\times10^{18}$ cm$^{-3}$. Carrier narrow region 250 is formed in group III-V compound semiconductor layer stack 20 such that emission region 200*a* into which carriers flow in emission layer 200 is located above and within the span of low dislocation density high conductance region 10*b*. Since surface-emitting laser element 1 has emission region 200*a* located above and within the span of low dislocation density high conductance region 10*b* that is a region having a dislocation density less than $1\times10^{6}$ cm$^{-2}$ and a carrier concentration of at least $1\times10^{18}$ cm$^{-3}$, the in-plane distribution of carriers flowing into emission region 200 is rendered uniform. The light emitted in emission region 200*a* is uniform and the light emitting efficiency is increased.

In the surface-emitting laser element of the second embodiment, conductive GaN substrate 10 further includes at least one of a high dislocation density high conductance region 10*a* that is a region having a dislocation of at least $1\times10^{6}$ cm$^{-2}$ and a carrier concentration of at least $1\times10^{18}$ cm$^{-3}$, and a low dislocation density low conductance region 10*c* that is a region having a dislocation density less than $1\times10^{6}$ cm$^{-2}$ and a carrier concentration less than $1\times10^{18}$ cm$^{-3}$. Since surface-emitting laser element 1 has emission region 200*a* located above and within the span of low dislocation density high conductance region 10*b* that is a region having a dislocation density less than $1\times10^{6}$ cm$^{-2}$ and a carrier concentration of at least $1\times10^{18}$ cm$^{-3}$, the in-plane distribution of carriers flowing into emission region 200*a* is rendered uniform even if at least one of high dislocation density high conductance region 10*a* and low dislocation density low conductance region 10*c* is included in conductive GaN substrate 10. The light emitted in emission region 200*a* is uniform, and the light emitting efficiency is increased.

Third Embodiment

A specific example of a surface-emitting laser element according to the present invention will be described hereinafter. Referring to FIG. 6, a surface-emitting laser element 1 according to a third embodiment includes a conductive GaN substrate 10, and a group III-V compound semiconductor layer stack 20 including an emission layer 200 formed on one main surface 10*m* of conductive GaN substrate 10. Referring to FIGS. 6A and 6B, the element further includes, on the uppermost layer (contact layer 229) of group III-V compound semiconductor layer stack 20, a pad electrode 17 for electrical connection with a bonding wire, an annular p type semiconductor layer side electrode 15 formed so as to be electrically connected to pad electrode 17, and a dielectric mirror 103 arranged at the inner circumferential side of annular semiconductor layer side electrode 15.

Referring to FIG. 6B representing a specific structure corresponding to a cross section of surface-emitting laser element 1, a buffer layer 201 is formed on one main surface 10*m* (the main surface where the group III-V compound semiconductor layer stack is formed, the same applies hereinafter) of n type conductive GaN substrate 10. For the material of buffer layer 201, n type GaN (GaN of n conductivity type) can be employed.

An n type layer side DBR 213 is formed on buffer layer 201. This DBR 213 is a multilayer film having a plurality of layers of n type AlGaN and n type GaN stacked. An n type clad layer 215 is formed on DBR 213. For the material of clad layer 215, n type AlGaN, for example, can be employed. Emission layer 200 is formed on clad layer 215. For this emission layer 200, a multiple quantum well emission layer having a multilayer film structure of a GaInN layer and a GaN layer, for example, stacked, can be employed. A p type clad layer 225 is formed on emission layer 200. For the material of this clad layer 225, p type AlGaN, for example, can be employed. A p type contact layer 227 is formed on clad layer 225. For the material of contact layer 227, GaN, for example, can be employed.

Carrier narrow layer 250a formed of an insulator is provided on contact layer 227. For the material of carrier narrow layer 250a, an insulation film formed of $SiO_2$, for example, can be employed. In this carrier narrow layer 250a, an opening having a circular planar shape is formed at to be located above and within the span of low dislocation density high conductance region 10b of n type conductive GaN substrate 10 and at a region located below dielectric mirror 103 that will be described afterwards. This opening is qualified as emission region 200a. In other words, emission region 200a is formed to be located above and within the span of low dislocation density high conductance region 10b and to be located below and within the span of the region where dielectric mirror 103 is formed (dielectric mirror formation region 103a). The diameter of this opening is equal to a width D (refer to FIG. 6). A p type contact layer 229 is formed on carrier narrow layer 250a. For the material of contact layer 229, GaN, for example, can be employed. Annular semiconductor layer side electrode 15 and dielectric mirror 103 set forth above are formed on contact layer 229. Dielectric mirror 103 may be a multilayer film formed of, for example, ZnS and $MgF_2$. The thickness T (refer to FIG. 6B) of DBR 213 is preferably at least 3 μm and not more than 6 μm.

If DBR 213 having a thickness of 3 μm or above is formed on a sapphire substrate, a significant strain will occur due to difference in the lattice constant between the sapphire substrate and DBR 213. As a result, a crack may be generated to degrade the property. In the case where DBR 213 is formed on conductive GaN substrate 10, the strain will be reduced since the lattice matching between conductive GaN substrate 10 and DBR 213 is increased significantly. As a result, crack generation can be suppressed. By employing conductive GaN substrate 10, a thick DBR 213 having a thickness in the range set forth above can be formed. By a virtue of such a thick DBR 213, high reflectivity for the light of a wavelength to be output as a laser beam can be realized. As a result, a laser beam can be output from the side of dielectric mirror 103.

In addition, a substrate side electrode 11 (n side electrode) is formed on the other main surface 10n (the main surface where the group III-V compound semiconductor layer stack is not formed; the same applies hereinafter) of an n type conductive GaN substrate (conductive GaN substrate of n conductivity type) 10.

Since the surface-emitting laser element of the present embodiment has emission region 200a of emission layer 200 located above and within the span of low dislocation density high conductance region 10b in conductive GaN substrate 10, the in-plane distribution of carriers flowing into emission region 200a is rendered uniform even if at least one of high dislocation density high conductance region 10a and low dislocation density low conductance region 10c is included in conductive GaN substrate 10. Light emission in emission region 200a is rendered uniform. In addition, the light emitting efficiency is further increased when low dislocation density high conductance region 10b has a dislocation density less than $1 \times 10^6$ cm$^{-2}$ and a carrier concentration of at least $1 \times 10^{18}$ cm$^{-6}$.

Fourth Embodiment

Another specific example of a surface-emitting laser element according to the present invention will be described hereinafter. Referring to FIG. 7, a surface-emitting laser element 1 of the present embodiment has a planar structure similar to that of the surface-emitting laser element of the third embodiment shown in FIG. 6, and differs in that dielectric mirror 103 as shown in FIG. 6 is not arranged at the inner circumferential side of annular semiconductor layer side electrode 15. Referring to the cross sectional structure of FIG. 7B, buffer layer 201, DBR 213, clad layer 215 and emission layer 200 are arranged on one main surface 10m of n type conductive GaN substrate 10, and substrate side electrode 11 (n side electrode) is formed on the other main surface 10n of n type conductive GaN substrate 10. The surface-emitting laser element of FIG. 7B is similar to the surface-emitting laser element of the third embodiment shown in FIG. 6B in the structure of the layers below emission layer 200. The surface-emitting laser element of FIG. 7B differs from the surface-emitting laser element of the third embodiment of FIG. 6B in the structure of the layers above emission layer 200.

As shown in FIG. 7B, the surface-emitting laser element of the present embodiment specifically has a p type clad layer 225 formed on emission layer 200. A p type layer side DBR 223 is formed on clad layer 225. DBR 223 takes a multilayer film structure having a plurality of types of nitride epitaxial layers stacked alternately. For example, DBR 223 may take a multilayer film structure having AlGaN and GaN stacked alternately, or a multilayer film structure having AlGaN and GaInN stacked alternately. Then, a p type contact layer 229 is formed on DBR 223. Annular semiconductor layer side electrode 15 set forth above is formed on contact layer 229. An insulative region 250b that is rendered insulative by implanting ions is formed in DBR 223 and clad layer 225. In clad layer 225, there is formed a region having a circular planar shape where insulative region 250b is not formed, at the region located immediately below the inner circumferential side of annular semiconductor layer side electrode 15, and also above and within the span of low dislocation density high conductance region 10b of n type conductive GaN substrate 10. This region is qualified as emission region 200a. The width D (diameter) of this region can be set to 5 μm, for example. The thickness T of DBRs 213 and 223 may be set to, for example, at least 3 μm and not more than 6 μm.

Since DBRs 213 and 223 formed of nitride semiconductor layers can be set relatively thick (film thickness of 3 μm to 6 μm) on conductive GaN substrate 10 in accordance with such a structure, the light emitted at emission layer 200 can be reflected sufficiently between the two DBRs 213 and 223. As a result, a laser beam of sufficient light quantity can be oscillated.

Since the surface-emitting laser element of the present embodiment has emission region 200a in emission layer 200 located above and within the span of low dislocation density high conductance region 10b in conductive GaN substrate 10, the in-plane distribution of carriers flowing into emission region 200a can be rendered uniform even if at least one of high dislocation density high conductance region 10a and low dislocation density low conductance region 10c is included in conductive GaN substrate 10. The light emitted in emission region 200a is uniform. When low dislocation density high conductance region 10b has a dislocation density less than $1\times10^6$ cm$^{-2}$ and a carrier concentration of at least $1\times10^{18}$ cm$^{-3}$, the light emitting efficiency is further improved.

Fifth Embodiment

A further specific example of a surface-emitting laser element according to the present invention will be described. A surface-emitting laser element 1 of the present embodiment has a semiconductor layer side electrode 15 and a pad electrode 17 electrically connected thereto formed on the uppermost layer (contact layer 229) of the group III-V compound semiconductor layer stack, as shown in FIG. 8A, with regards to the plane structure. With regards to the cross sectional structure, n type clad layer 215, emission layer 200, p type clad layer 225, photonic crystal layer 223, p type clad layer 226 and contact layer 229 constituting group III-V compound semiconductor layer stack 20 are formed on one main surface 10m of n type conductive GaN substrate 10, as shown in FIG. 8B. Although not illustrated in FIG. 8B, a buffer layer may be formed between conductive GaN substrate 10 and n type clad layer 215. Semiconductor layer side electrode 15 is formed on contact layer 229. Substrate side electrode 11 (n side electrode) is formed on the other main surface 10n of n type conductive GaN substrate 10.

The surface-emitting laser element of the present embodiment shown in FIG. 8B is absent of the complicated resonator structure of DBR 213 and dielectric mirror 103 found in the surface-emitting laser element of the third embodiment shown in FIG. 6B, or the complicated resonator structure of the pair of DBRs 213 and 223 found in the surface-emitting laser element of the fourth embodiment shown in FIG. 7B. Surface emission is allowed by photonic crystal layer 233 functioning as a two-dimensional diffraction grating formed between two p type clad layers 225 and 226.

In the surface-emitting laser element of the present embodiment shown in FIG. 8B, semiconductor layer side electrode 15 is formed on contact layer 229 that is the uppermost layer of group III-V compound semiconductor layer stack 20, and also above and within the span of low dislocation density high conductance region 10b of conductive GaN substrate 10. By semiconductor layer side electrode 15 and substrate side electrode 11 formed on group III-V compound semiconductor layer stack 20 and conductive GaN substrate 10, respectively, emission region 200a is located above and within the span of low dislocation density high conductance region 10b. Emission region 200a can have a width D (diameter) of approximately 50 μm to 200 μm, for example.

Referring to FIGS. 8A and 8B, the surface-emitting laser element of the present embodiment has n type clad layer 215, emission layer 200, p type clad layer 225, photonic crystal layer 233, p type clad layer 226, and contact layer 229 stacked in this order on one main surface 10m of conductive GaN substrate 10. Semiconductor layer side electrode 15 is provided on contact layer 229. Substrate side electrode 11 (n side electrode) is provided at the other main surface 10n of conductive GaN substrate 10. Semiconductor layer side electrode 15 and substrate side electrode 11 are formed of Au (gold), for example.

Figure 9:
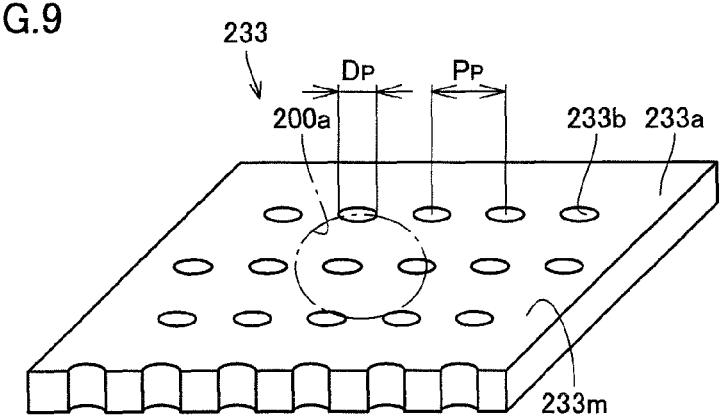
FIG. 9 is a schematic perspective view of a photonic crystal layer employed in the present invention.

Emission layer 200 is formed of a multiple quantum well of $Al_xGa_{1-x-y}In_yN$ ($0 \leq x,y \leq 1$, $0 \leq x+y \leq 1$), for example. Emission layer 200 may be formed of a single semiconductor material. Emission layer 200 can be formed as a plurality of quantum wires provided extending in a predetermined direction along photonic crystal layer 233, or as a plurality of quantum boxes provided along photonic crystal layer 233. Each quantum wire has a dimension (for example, approximately several ten nm) that allows the energy level of electrons to be discrete in the two directions, i.e. the longitudinal direction and a direction orthogonal thereto. Each quantum box has a dimension (for example, approximately several ten nm) that allows the energy level of electrons to be discrete in three directions orthogonal to each other. Since the state density is increased by having such a quantum structure, the light emitting efficiency is improved and the emission spectrum is rendered sharp. Photonic crystal layer 233 will be described with reference to FIG. 9 hereinafter.

Photonic crystal layer 233 includes a crystal layer 223a, and a plurality of diffraction grating holes 233b having a refractive index lower than that of crystal layer 233a. Crystal layer 233a is formed of GaN, and the holes formed in crystal layer 233a are diffraction grating holes 233b. In other words, the air constitutes diffraction grating hole 233a.

In photonic crystal layer 233, a plurality of diffraction grating holes 233b are provided to form a triangular lattice or a square lattice on one main surface of crystal layer 233a. Each diffraction grating hole 233b is provided as a columnar (for example, a cylindrical) space. The distance $P_P$ between the center of one diffraction grating hole 223b and the center of an adjacent diffraction grating hole 233b is equal for respective diffraction grating holes, and is 0.16 μm, for example. Further, the diameter $D_P$ of diffraction grating holes 233b is 0.06 μm, for example.

In photonic crystal layer 233, crystal layer 233a has a first refractive index (2.54 for GaN), and diffraction grating holes 233b formed periodically have a second refractive index (1 for air). Diffraction grating holes 233b can be filled with a material different from that of crystal layer 233a. However, diffraction grating holes 233b are preferably not filled with anything (i.e. corresponds to a state where gas such as air is present) in order to achieve a great difference between the first refractive index and the second refractive index. Such a large difference in refractive index allows light confinement in the medium of the first refractive index. The material to fill diffraction grating holes 233b, i.e. the dielectric material of low refractive index, includes a silicon nitride film ($SiN_x$) or the like.

Photonic crystal layer 233 corresponds to a diffraction grating having an equal period (value corresponding to lattice constant) in a first direction and a second direction at a predetermined degree to the first direction. Various selections are allowed for the aforementioned two directions and the period in these directions for photonic crystal layer 233. By setting the dislocation density of the region of at least conductive GaN substrate 10 and crystal layer 233a within the span of emission region 200a to not more than $1\times10^6$ cm$^{-2}$, an aggregate of defects due to dislocation will no longer be generated during the etching step to form diffraction grating holes 233b in crystal layer 233a within the span of emission region 200a.

Surface emission of the surface-emitting laser element of the present embodiment will be described hereinafter. Referring to FIG. 8B, application of a positive voltage to semiconductor layer side electrode 15 causes introduction of holes from p type clad layers 255 and 226 into emission layer 200, and introduction of electrons from n type clad layer 215 to emission layer 200. Introduction of holes and electrons (holes and electrons are generically referred to as carriers) into emission layer 200 induces recombination of carriers to generate light. The wavelength of the generated light is defined by the bandgap of the semiconductor layer in emission layer 200.

Although the light generated at emission layer 200 is confined in emission layer 200 by n type clad layer 215 and p type clad layer 225, some of the light arrives at photonic crystal layer 233 as evanescent light. When the wavelength of the evanescent light arriving at photonic crystal layer 233 matches the predetermined period of photonic crystal layer 233, the light will repeat diffraction at the wavelength corresponding to that period to generate a standing wave, and the phase condition is defined. The light having the phase defined by photonic crystal layer 233 is fed back to the light in emission layer 200 to still generate a standing wave. This standing wave meets the light wavelength and phase condition defined at photonic crystal layer 233.

Such a phenomenon can occur at emission region 200a since emission layer 200 and photonic crystal layer 233 are formed with a two-dimensional spread. In the case where a sufficient amount of light is accumulated under this state, light with matching wavelength and phase condition is output in stimulated emission from the main surface of the outermost layer of group III-V compound semiconductor layer stack 20 in a direction perpendicular to main surface 233m of photonic crystal layer 233 (upwards in FIG. 8B).

By way of example, the dimension of each portion of semiconductor laser element 1 of the present embodiment will be cited hereinafter. The thickness of conductive GaN substrate 10 is, for example, 100 μm. The thickness of photonic crystal layer 233 is, for example, 0.1 μm. The thickness of each of n type clad layer 215 and p type clad layer 226 is, for example, 0.5 μm. The thickness of each of emission layer 200 and p type clad layer 225 is, for example, 0.1 μm.

Figure 16:
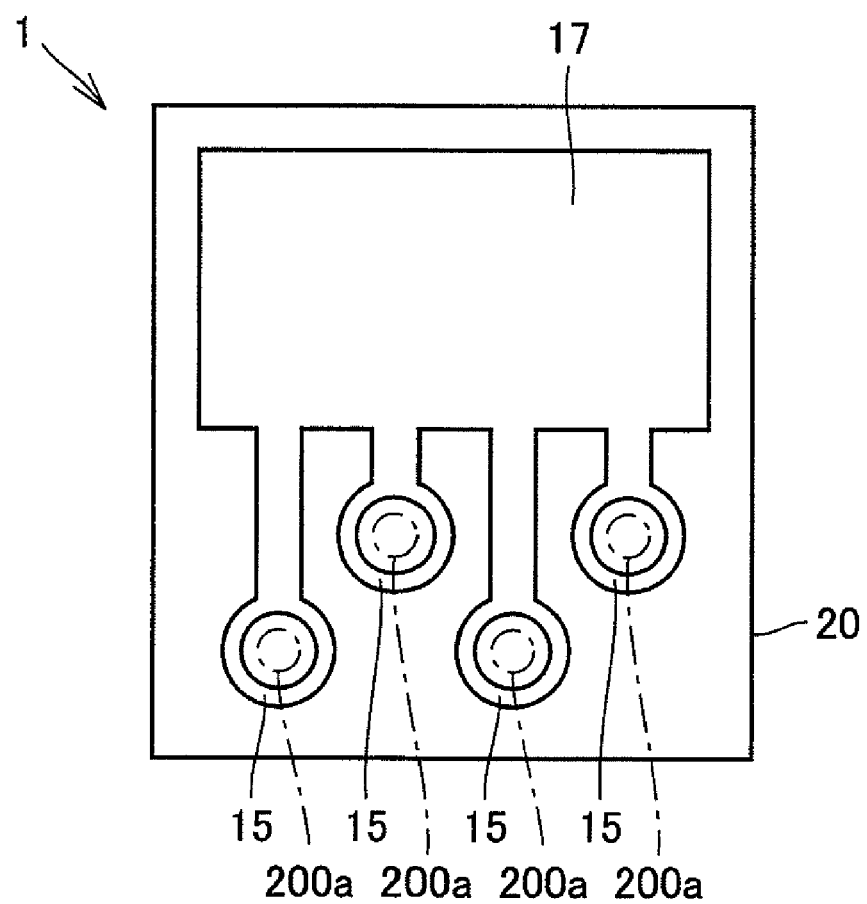
FIG. 16 is a schematic plan view of a further example of a surface-emitting laser element according to the present invention.

The above-described third to fifth embodiments all correspond to an element having one emission region 200a for one surface-emitting laser element 1, as shown in FIGS. 6A, 7A and 8A. However the number of emission regions is not limited to one in one surface-emitting laser element. For example, an element having a plurality of surface emitting regions for one surface-emitting laser element, as shown in FIG. 16, is preferable from the standpoint of increasing the light emitting intensity per one element.

Sixth Embodiment

Referring to FIGS. 17A, 17B, 18A and 18B, a fabrication method of a surface-emitting laser array according to the present invention is directed to a fabrication method of a surface-emitting laser array 2 including a plurality of surface-emitting laser elements 1. The fabrication method includes: a step of preparing a conductive GaN multiple-region substrate including, as a conductive GaN substrate 10, a high dislocation density high conductance region 10a having a high dislocation density and carrier concentration, a low dislocation density high conductance region 10b having a dislocation density lower than that of high dislocation density high conductance region 10a, and a low dislocation density low conductance region 10c having a dislocation density and carrier concentration lower than those of high dislocation density high conductance region 10a; a semiconductor layer stack formation step of forming a group III-V compound semiconductor layer stack 20 including an emission layer 200 on one main surface 10m of the conductive GaN multiple-region substrate; and an electrode formation step of forming a semiconductor layer side electrode 15 on the uppermost layer of group III-V compound semiconductor layer stack 20, and a substrate side electrode 11 on the other main surface 10n of the conductive GaN multiple-region substrate. Group III-V compound semiconductor layer stack 20, semiconductor layer side electrode 15 and substrate side electrode 11 are formed such that emission region 200a into which carriers flow in emission layer 200 of each surface-emitting laser element 1 in surface-emitting laser array 2 is limited to be located above and within the span of low dislocation density high conductance region 10b.

In the fabrication method of a surface-emitting laser array element of the present embodiment, by forming group III-V compound semiconductor layer stack 20, semiconductor layer side electrode 15 and substrate side electrode 11 such that emission region 200a into which carriers flow in emission layer 200 of each surface-emitting laser element 1 in surface-emitting laser array 2 is limited to be located above and within the span of low dislocation density high conductance region 10b, carriers flow uniformly into emission region 200a. Therefore, a surface-emitting laser array 2 having uniform light emission in emission region 200a can be obtained.

In the fabrication method of a surface-emitting laser array of the sixth embodiment, group III-V compound semiconductor layer stack 20, semiconductor layer side electrode 15, and substrate side electrode 11 are formed such that emission region 200a into which carriers flow in emission layer 200 of each surface-emitting laser element 1 in surface-emitting laser array 2 is limited to be located above and within the span of low dislocation density high conductance region 10b. Although not particularly limited, the method set forth below is preferably employed for the formation method of group III-V compound semiconductor layer stack 20, semiconductor side substrate 15 and substrate side electrode 11.

Sixth Embodiment-A1

Figure 17A:
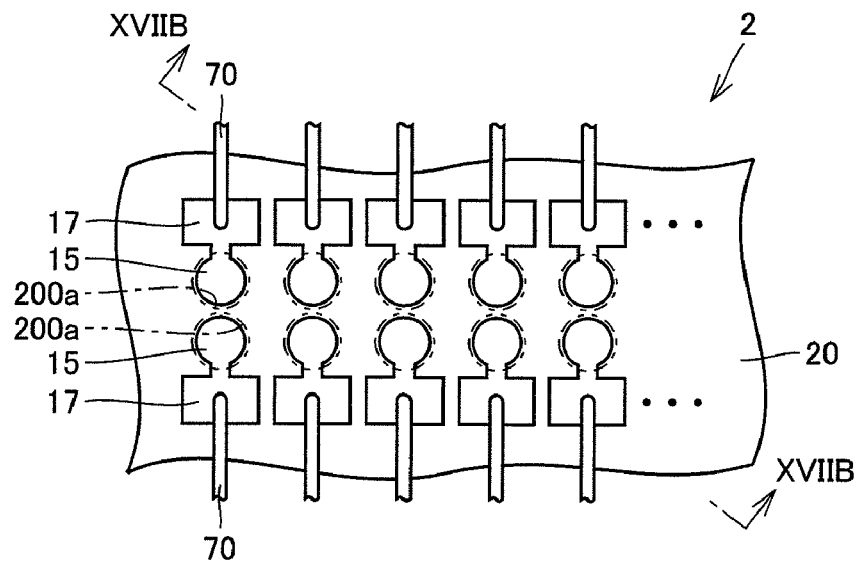
FIG. 17A is a schematic plan view of an example of a surface-emitting laser array according to the present invention.
Figure 17B:
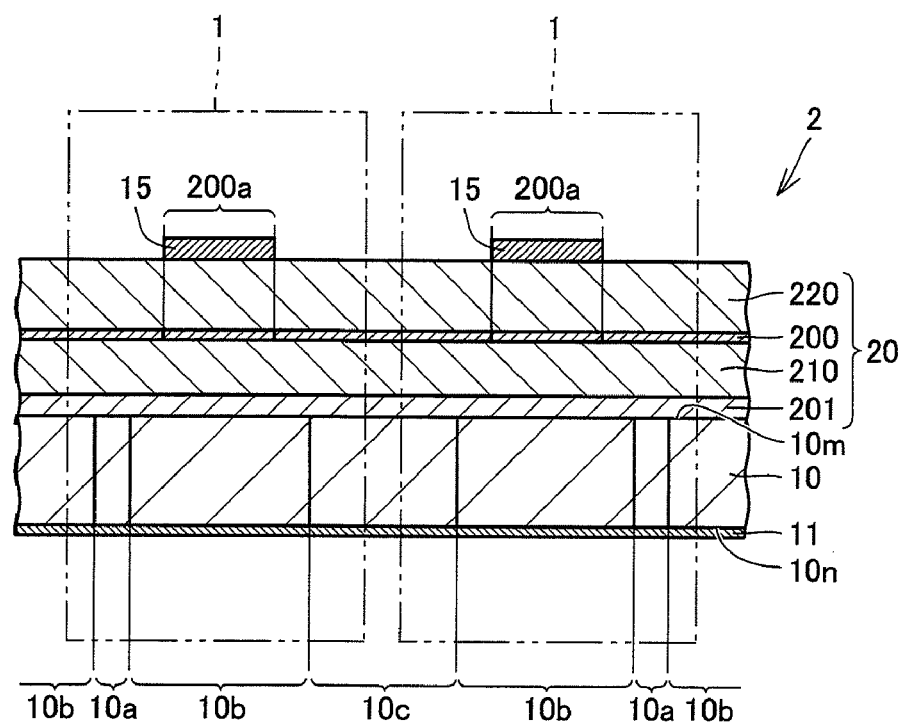
FIG. 17B is a schematic sectional view taken along line XVIIB-XVIIB of FIG. 17A.

In the electrode formation step of the fabrication method of a surface-emitting laser array of the sixth embodiment with reference to FIGS. 17A and 17B, semiconductor layer side electrode 15 can be formed at a location above and within the span of low dislocation density high conductance region 10b such that emission region 200a is limited to be located above and within the span of low dislocation density high conductance region 10b. According to the sixth embodiment A-1, even if substrate side electrode 11 is formed spreading as far as below high dislocation density high conductance region 10a or low dislocation density low conductance region 10c in addition to below low dislocation density high conductance region 10b, formation of semiconductor layer side electrode 15 at a location above and within the span of low dislocation density high conductance region 10b allows emission region 200a into which carriers flow in emission layer 200 of each surface-emitting laser element 1 to be limited to a location above and within the span of low dislocation density high conductance region 10b. Therefore, carriers flow uniformly into emission region 200a. Thus, a surface-emitting laser array having uniform light emission in emission region 200a can be obtained.

Referring to FIGS. 17A and 17B, when semiconductor side substrate 15 is not transparent in the surface-emitting laser array of the sixth embodiment A-1, light emission in emission region 200a (diameter D) will be externally provided only from the main surface of the region in proximity to the outer circumference of semiconductor layer side electrode 15 (referring to the outer side region up to approximately 5 μm from the outer circumference, the same applies hereinafter). By providing at least one opening (not shown) in semiconductor layer side electrode 15, light emission in emission region 200a can be output through the opening. Further, by employing a transparent electrode for semiconductor layer side electrode 15, light emission of emission region 200a can be externally provided from the entire region of semiconductor layer side electrode 15. Although it is apparent from FIG. 17B that emission region 200a of emission layer 200 substantially matches the formation region of semiconductor layer side electrode 15, the boundary line is displaced in FIG. 17A to aid visuality.

Sixth Embodiment-A2

Figure 18A:
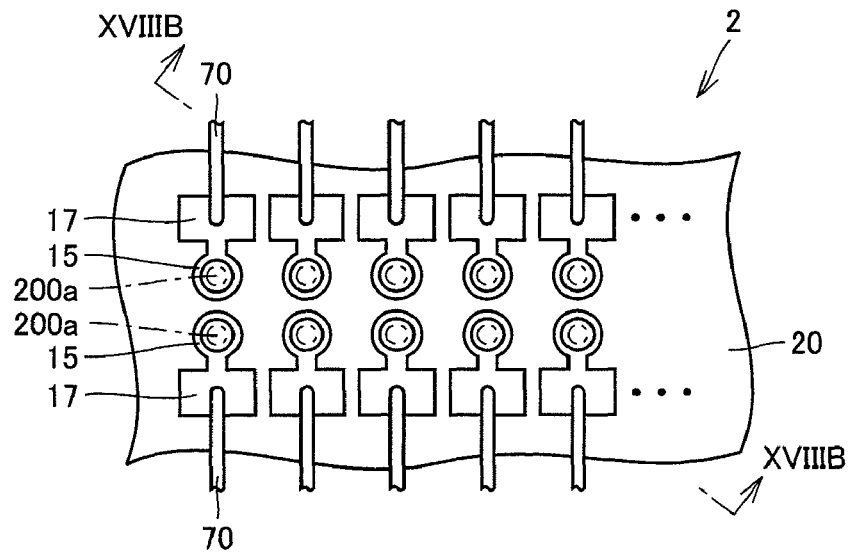
FIG. 18A is a schematic plan view of another example of a surface-emitting laser array according to the present invention.
Figure 18B:
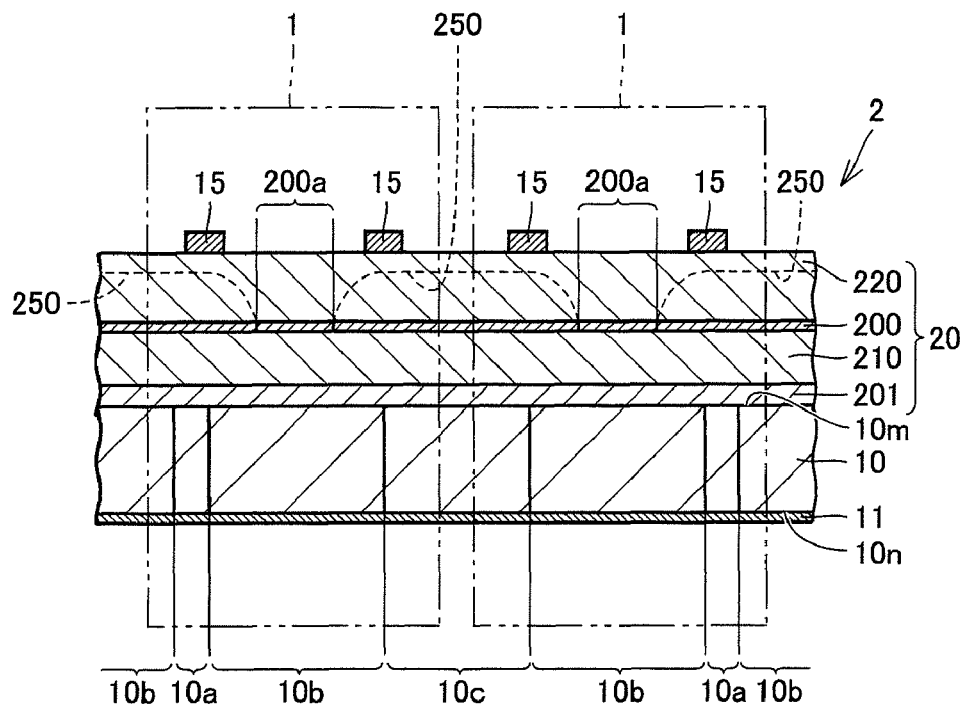
FIG. 18B is a schematic sectional view taken along line XVIIIB-XVIIIB of FIG. 18A.

Referring to FIGS. 18A and 18B, in the semiconductor formation step of the fabrication method of a surface-emitting laser array of the sixth embodiment, a carrier narrow region 250 can be formed in group III-V compound semiconductor layer stack 20 such that emission region 200a is limited to a location above and within the span of low dislocation density high conductance region 10b. According to the sixth embodiment-A2, even if semiconductor layer side electrode 15 and substrate side electrode 11 are formed spreading as far as above or below high dislocation density high conductance region 10a or low dislocation density low conductance region 10c in addition to above or below low dislocation density high conductance region 10b, formation of carrier narrow region 250 in group III-V compound semiconductor layer stack 20 allows emission region 200a into which carriers flow in emission layer 200 of each surface-emitting laser element 1 to be limited to a location above and within the span of low dislocation density high conductance region 10b. Therefore, carriers flow uniformly into emission region 200a. Thus, a surface-emitting laser array having uniform light emission in emission region 200a can be obtained.

The method of forming carrier narrow region 250 is not particularly limited, as long as the method suits the object of the present invention. For example, in the case where the region is partitioned in a mesa shape by mesa etching, for example, some of the carriers flowing in will be recombined by the etching damage at the mesa side plane. From the standpoint of preventing such carrier recombination, the method of forming carrier narrow layer 250a from an insulator, as shown in FIG. 6B, the method of forming an insulative region 250b that has been rendered insulative by ion implantation, as shown in FIG. 7B, or the like can be cited.

Referring to FIGS. 18A and 18B, an annular semiconductor layer side electrode 15 having an opening located above and within the span of low dislocation density high conductance region 10b of conductive GaN substrate 10 is formed as semiconductor layer side electrode 15 of each surface-emitting laser element 1. Since emission region 200a is limited to be within the span of the opening region of annular semiconductor side substrate 15 by carrier narrow region 250 set forth above, light emission of emission region 200a of each surface-emitting laser element 1 is output outside from the opening region of annular semiconductor layer side electrode 15.

With regards to the method of limiting emission region 200a into which carriers flow in emission layer 200 of each surface-emitting laser element to be located above and within the span of low dislocation density high conductance region 10b, there has been described the method of forming semiconductor layer side electrode 15 at a location above and within the span of low dislocation density high conductance region 10b in the sixth embodiment-A1, and the method of forming carrier narrow region 250 in group III-V compound semiconductor layer stack 20 in the sixth embodiment-A2. Preferably, the method of forming carrier narrow region 250 in group III-V compound semiconductor layer stack 20, and forming semiconductor layer side electrode 15 at a location above and within the span of low dislocation density high conductance region 10b is employed.

Although the stack structure of group III-V compound semiconductor layer stack 20 that allows surface emission is not particularly limited in each surface-emitting element obtained by the fabrication method of the surface-emitting laser array of the sixth embodiment, a combined structure of an n type layer side DBR (multilayer distributed Bragg reflector; the same applies hereinafter) 213 and a dielectric mirror 103 shown in FIG. 6B, a combined structure of an n type layer side DBR 213 and p type layer side DBR 223, as shown in FIG. 7B, a structure including a photonic crystal layer 233, as shown in FIG. 8B, and the like are preferably cited.

In the fabrication method of a surface-emitting laser element of the sixth embodiment, arrangement of low dislocation density high conductance region 10b on main surface 10m of the conductive GaN multiple-region substrate (conductive GaN substrate 10) is critical from the standpoint of forming emission region 200a of emission layer 200 of each surface-emitting laser element 1 at a location above and within the span of low dislocation density high conductance region 10b of the conductive GaN multiple-region substrate (conductive GaN substrate 10). This issue will be described specifically hereinafter.

Sixth Embodiment-B1

Referring to FIGS. 3A, 3B, 4A and 4B, in the conductive GaN multiple-region substrate (conductive GaN substrate 10) employed in the fabrication method of a surface-emitting laser array of the sixth embodiment, high dislocation density high conductance region 10a is formed in dots. Each dot of high dislocation density high conductance region 10a is arranged on periodic triangular lattice points (in the case of FIG. 3A) or square lattice points (in the case of FIG. 4A) with $P_D$ as the lattice constant on main surfaces 10m and 10n of the conductive GaN multiple-region substrate (conductive GaN substrate 10). Low dislocation density high conductance region 10b corresponds to a doughnut-like region excluding respective dots from a circle region with a radius $P_D/2$ about the center of each dot. The outer perimeter of high dislocation density high conductance region 10a and low dislocation density high conductance region 10b actually takes a polygonal form close to a circle, and approximates a circle as shown in FIG. 3A or 4A. By forming emission region 200a of each surface-emitting laser element 1 to be located above and within the span of low dislocation density high conductance region 10b identified as set forth above, the in-plane distribution of carriers flowing into emission region 200a is rendered uniform. A surface-emitting laser array 2 including a plurality of surface-emitting laser elements 1 having uniform light emission in emission region 200a can be readily obtained with favorable yield.

Sixth Embodiment-B2

Referring to FIGS. 5A and 5B, in the conductive GaN multiple-region substrate (conductive GaN substrate 10) employed in the fabrication method of the surface-emitting laser array of the sixth embodiment, high dislocation density high conductance region 10a is formed in stripes. Each stripe of high dislocation density high conductance region 10a is arranged at a periodic interval $P_S$ on main surfaces 10m and 10n of the conductive GaN multiple-region substrate. Low dislocation density high conductance region 10b is a region excluding each stripe and low dislocation density low conductance region 10c formed with the center located $P_S/2$ from the center of each stripe from the entire region of the conductive GaN multiple-region substrate (conductive GaN substrate 10). By forming emission region 200a of each surface-emitting laser element 1 to be located above and within the span of low dislocation density high conductance region 10b identified as set forth above, the in-plane distribution of carriers flowing into emission region 200a is rendered uniform. A surface-emitting laser array 2 including a plurality of surface-emitting laser elements 1 having uniform light emission in emission region 200a can be readily achieved with favorable yield.

Sixth Embodiment-C

In the conductive GaN multiple-region substrate (conductive GaN substrate 10) employed in the fabrication method of a surface-emitting laser array of the sixth embodiment, preferably high dislocation density high conductance region 10a is a region having a dislocation density of at least $1\times10^6$ cm$^{-2}$ and a carrier concentration of at least $1\times10^{18}$ cm$^{-3}$; low dislocation density high conductance region 10b is a region having a dislocation density less than $1\times10^6$ cm$^{-2}$ and a carrier concentration of at least $1\times10^{18}$ cm$^{-3}$; and low dislocation density low conductance region 10c is a region having a dislocation density less than $1\times10^6$ cm$^{-2}$ and a carrier concentration less than $1\times10^{18}$ cm$^{-3}$. By forming an emission region 200a of each surface-emitting laser element 1 at a location above and within the span of low dislocation density high conductance region 10b having a dislocation density less than $1\times10^6$ cm$^{-2}$ and a carrier concentration of at least $1\times10^{18}$ cm$^{-3}$ based on the conductive GaN multiple-region substrate, the in-plane distribution of carriers into which current flows uniformly into the emission region is rendered uniform. Thus, a surface-emitting laser array 2 including a plurality of surface-emitting laser elements 1 having uniform light emission in the emission region and of high light emitting efficiency can be obtained with favorable yield.

Seventh Embodiment

Referring to FIGS. 17A, 17B, 18A and 18B, a surface-emitting laser array of the present invention is directed to a surface-emitting laser array 2 including a plurality of surface-emitting laser elements 1, wherein surface-emitting laser element 1 includes a conductive GaN substrate 10, a group III-V compound semiconductor layer stack 20 including an emission layer 200 formed on one main surface 10m of conductive GaN substrate 10, a semiconductor layer side electrode 15 formed on the uppermost layer of group III-V compound semiconductor layer stack 20, and a substrate side electrode 11 formed on the other main surface 10n of conductive GaN substrate 10. Surface-emitting laser array 2 includes conductive GaN multiple-region substrate (conductive GaN substrate 10), including a high dislocation density high conductance region 10a having a high dislocation density and carrier concentration, a low dislocation density high conductance region 10b having a dislocation density lower than that of high dislocation density high conductance region 10a, and a low dislocation density low conductance region 10c having a dislocation density and carrier concentration lower than those of high dislocation density high conductance region 10a. Emission region 200a into which carriers flow in emission layer 200 of each surface-emitting laser element 1 included in surface-emitting laser array 2 is located above and within the span of low dislocation density high conductance region 10b.

Since surface-emitting laser array 2 of the seventh embodiment has emission region 200a of each surface-emitting laser element 1 located above and within the span of low dislocation density high conductance region 10b, the in-plane distribution of carriers flowing into emission region 200a is rendered uniform. Therefore, light emission in emission region 200a is uniform. Surface-emitting laser array 2 of the seventh embodiment preferably has the structure of the seventh embodiment-A1 or the seventh embodiment-A2 that will be described hereinafter, such that emission region 200a of each surface-emitting laser element 1 is located above and within the span of low dislocation density high conductance region 10b.

Seventh Embodiment-A1

Referring to FIGS. 17A and 17B, an example of a surface-emitting laser array of the seventh embodiment is directed to a surface-emitting laser array 2 including a plurality of surface-emitting laser elements 1. Surface-emitting laser element 1 includes a conductive GaN substrate 10, a group III-V compound semiconductor layer stack 20 including an emission layer 200 formed on one main surface 10m of conductive GaN substrate 10, a semiconductor layer side electrode 15 formed on the uppermost layer of group III-V compound semiconductor layer stack 20, and a substrate side electrode 11 formed on the other main surface 10n of conductive GaN substrate 10. Surface-emitting laser array 2 includes a conductive GaN multiple-region substrate (conductive GaN substrate 10) including a high dislocation density high conductance region 10a having a high dislocation density and carrier concentration, a low dislocation density high conductance region 10b having a dislocation density lower than that of high dislocation density high conductance region 10a, and a low dislocation density low conductance region 10c having a dislocation density and carrier concentration lower than those of high dislocation density high conductance region 10a. The semiconductor layer side electrode is formed at a position above and within the span of the low dislocation density high conductance region such that emission region 200a into which carriers flow in emission layer 200 of each surface-emitting laser element 1 included in surface-emitting laser array 2 is located above and within the span of low dislocation density high conductance region 10b.

Since surface-emitting laser array 2 of the seventh embodiment-A1 has emission region 200a of each surface-emitting laser element 1 located above and within the span of low dislocation density high conductance region 10b, in-plane distribution of carriers flowing into emission region 200a is rendered uniform. Therefore, light emission in emission region 200a is uniform.

Seventh Embodiment-A2

Referring to FIGS. 18A and 18B, another example of a surface-emitting laser array according to the seventh embodiment is directed to a surface-emitting laser array 2 including a plurality of surface-emitting laser elements 1. Surface-emitting laser element 1 includes a conductive GaN substrate 10, a group III-V compound semiconductor layer stack 20 including an emission layer 200 formed on one main surface 10m of conductive GaN substrate 10, a semiconductor layer side electrode 15 formed on the uppermost layer of group III-V compound semiconductor layer stack 20, and a substrate side electrode 11 formed on the other main surface 10n of conductive GaN substrate 10. Surface-emitting laser array 2 includes a conductive GaN multiple-region substrate (conductive GaN substrate 10) including a high dislocation density high conductance region 10a having a high dislocation density and carrier concentration, a low dislocation density high conductance region 10b having a dislocation density lower than that of high dislocation density high conductance region 10a, and a low dislocation density low conductance region 10c having a dislocation density and carrier concentration lower than those of high dislocation density high conductance region 10a. A carrier narrow region 250 is formed in group III-V compound semiconductor layer stack 20 such that emission region 200a into which carriers flow in emission layer 200 of each surface-emitting laser element 1 included in surface-emitting laser array 2 is located above and within the span of low dislocation density high conductance region 10b.

Since surface-emitting laser array 2 of the seventh embodiment-A2 has emission region 200a of each surface-emitting laser element 1 located above and within the span of low dislocation density high conductance region 10b, the in-plane distribution of carriers flowing into emission region 200a is rendered uniform. The light emitted in emission region 200a is uniform.

In the conductive GaN multiple-region substrate (conductive GaN substrate 10) of the surface-emitting laser array of the seventh embodiment, preferably high dislocation density high conductance region 10a is a region having a dislocation density of at least $1 \times 10^6$ cm$^{-2}$ and a carrier concentration of at least $1 \times 10^{18}$ cm$^{-3}$; low dislocation density high conductance region 10b is a region having a dislocation density less than $1 \times 10^6$ cm$^{-2}$ and a carrier concentration of at least $1 \times 10^{18}$ cm$^{-3}$; and low dislocation density low conductance region 10c is a region having a dislocation density less than $1 \times 10^6$ cm$^{-2}$ and a carrier concentration less than $1 \times 10^{18}$ cm$^{-3}$. Since surface-emitting laser array 2 has emission region 200a of each surface-emitting laser element 1 located above and within the span of low dislocation density high conductance region 10b that is a region having a dislocation density less than $1 \times 10^6$ cm$^{-2}$ and a carrier concentration of at least $1 \times 10^{18}$ cm$^{-3}$, the in-plane distribution of carriers flowing into emission region 200a is rendered uniform. Therefore, light emission in emission region 200a is uniform, and light emitting efficiency is increased.

Referring to FIGS. 17A, 18A and 18B, surface-emitting laser array 2 of the seventh embodiment is configured having a plurality of unitary elements of surface-emitting laser element 1 aligned on a single conductive GaN substrate 10 and a single stack of group III-V compound semiconductor layer stack 20 (a plurality of unitary elements are formed using one stack). FIGS. 17A and 17B correspond to an arrangement of the surface-emitting laser element shown in FIGS. 1A and 1B, that is a unitary element, aligned in two rows. Further, FIGS. 18A and 18B correspond to an arrangement of the surface-emitting laser element shown in FIGS. 2A and 2B, that is a unitary element, aligned in two rows. Pad electrode 17 in the unitary element is fixedly connected to a bonding wire 70 made of gold. By such a surface-emitting laser array, sufficient laser beam power can be obtained.

EXAMPLE

Example 1

A specific example of a surface-emitting laser element of the third embodiment will be described hereinafter. On a GaAs substrate (underlying substrate) having the seed of an SiO$_2$ film formed in stripes at the interval of 400 µm, an n type conductive GaN multiple-region substrate including a high dislocation density high conductance region 10a having a dislocation density of at least $1 \times 10^6$ cm$^{-2}$ and a carrier concentration of at least $1 \times 10^{18}$ cm$^{-3}$, a low dislocation density high conductance region 10b having a dislocation density less than $1 \times 10^6$ cm$^{-2}$ and a carrier concentration of at least $1 \times 10^{18}$ cm$^{-3}$, and a low dislocation density low conductance region 10c having a dislocation density less than $1 \times 10^6$ cm$^{-2}$ and carrier concentration less than $1 \times 10^{18}$ cm$^{-3}$ was formed as a conductive GaN substrate 10 by facet-growth using Si as a dopant through HVPE. The dislocation density of each region was measured by the CL scheme, and the carrier concentration in each region was measured by the C-V scheme and Hall measurement scheme.

Referring to FIG. 6B, a group III-V compound semiconductor layer stack 20 including an emission layer 200 was formed on one main surface 10m of the n type conductivity GaN multiple-region substrate (conductive GaN substrate 10). An annular semiconductor layer side electrode 15 was formed on the uppermost layer of this group III-V compound semiconductor layer stack. A substrate side electrode 11 was formed on the other main surface 10n of the n type conductive GaN multiple-region substrate (conductive GaN substrate 10). Emission region 200a of emission layer 200 was located above and within the span of low dislocation density high conductance region 10b.

Group III-V compound semiconductor layer stack 20 was formed by MOCVD (Metal Organic Chemical Vapor Deposition). Specifically, group III-V compound semiconductor layer stack 20 was formed as set forth below.

First, n type GaN buffer layer was formed as buffer layer 201 on the n type conductive GaN multiple-region substrate (conductive GaN substrate 10). DBR 213 was formed on buffer layer 201. For this DBR 213, Al$_{0.3}$Ga$_{0.7}$N/GaN multilayer structure (a layered structure having an Al$_{0.3}$Ga$_{0.7}$N layer and GaN layer alternately stacked) was employed. The total thickness per one set (one pair) of the Al$_{0.3}$Ga$_{0.7}$N layer and GaN layer was approximately 86 nm, and a multilayer structure of 60 pairs was produced. An n type clad layer 215 was formed on this DBR 213. For emission layer 200, a Ga$_{0.9}$In$_{0.1}$N/GaN multiple quantum well structure was formed on clad layer 215. Specifically, a multilayer structure having a Ga$_{0.9}$In$_{0.1}$N and GaN layer stacked alternately was formed. On this emission layer 200, p type clad layer 225 having a structure similar to that of clad layer 215 set forth above was formed. N type clad layer 215 was an n type Al$_{0.15}$Ga$_{0.85}$N clad layer, and p type clad layer 225 was a p type Al$_{0.15}$Ga$_{0.85}$N clad layer.

Then, a p type contact layer 227 was formed on p type clad layer 225. This p type contact layer 227 was a p type GaN contact layer. A current narrow layer 250a formed of an SiO$_2$ insulator was provided on this p type contact layer 227. Current narrow layer 250a was formed such that emission region 200a specified by current narrow layer 250a (the region defined by the opening having a circular planar shape, formed by current narrow layer 250a) was located above and within the span of low dislocation density high conductance region 10b in conductive GaN substrate 10. The diameter D of emission region 200a was 5 µm. A p type contact layer 229 having a composition identical to that of p type contact layer 227 set forth above was formed on current narrow layer 250a.

Then, an annular semiconductor layer side electrode 15 (p side electrode) and a dielectric mirror 103 were formed on p type contact layer 229. A substrate side electrode 11 (n side electrode) was formed on the other main surface 10n of conductive GaN substrate 10. Thus, the surface-emitting laser element of the present example was obtained. For dielectric mirror 103, a ZnS/MgF$_2$ multilayer film (12 pairs) having a reflectivity of 99% with respect to light of a wavelength in the vicinity of 420 nm was employed. Dielectric mirror 103 was formed so that a formation region 103a of dielectric mirror 103 includes the entirety of emission region 200a. Annular semiconductor layer side electrode 15 arranged so as to surround dielectric mirror 103 serves to introduce current into the above-described emission region.

Upon applying current to the obtained surface-emitting laser element, laser oscillation at the current density of at least 8kA/cm$^{-2}$ was observed, and light emittance thereof was uniform.

Comparative Example 1

A surface-emitting laser element was obtained in a manner similar to that of Example 1 except that current narrow layer 250 was formed such that emission region 200a is located above and within the span of low dislocation density high conductance region 10b and low dislocation density low conductance region 10c of conductive GaN substrate 10. The area ratio of low dislocation density high conductance region 10b to low dislocation density low conductance region 10c located below and within the span of emission region 200a was 3:1. Upon applying current to the obtained surface-emitting laser element, laser oscillation at the current density of at least 7.5 kA/cm$^{-2}$ was observed, and light emittance thereof was not uniform.

Example 2

A specific example of the surface-emitting laser element of the fourth embodiment will be described hereinafter. First, a conductive GaN multiple-region substrate (conductive GaN substrate 10) having properties similar to those of Example 1 was produced. Then, referring to FIG. 7B, group III-V compound semiconductor layer stack 20 including emission region 200 was formed on one main surface 10m of the n type conductive GaN multiple-region substrate (conductive GaN substrate 10). Annular semiconductor layer side electrode 15 was formed on the uppermost layer of this group III-V compound semiconductor layer stack. Substrate side electrode 11 was formed on the other main surface 10n of the n type conductive GaN multiple-region substrate (conductive GaN substrate 10). Emission region 200a of emission layer 200 was set to be located above and within the span of low dislocation density high conductance region 10b.

Group III-V compound semiconductor layer stack 20 was formed by MOCVD (Metal Oxide Chemical Vapor Deposition). Specifically, group III-V compound semiconductor layer stack 20 was formed as set forth below.

In a manner similar to that of Example 1, buffer layer 201 (n type GaN buffer layer), DBR 213 (multilayer structure of 60 pairs of $Al_{0.3}Ga_{0.7}N$/GaN; total thickness per pair of $Al_{0.3}Ga_{0.7}N$ layer and GaN layer was approximately 80 nm), n type clad layer 215 (n type $Al_{0.15}Ga_{0.85}N$ clad layer), emission layer 200 ($Ga_{0.9}In_{0.1}N$/GaN multiple quantum well structure), and p type clad layer 225 (p type $Al_{0.15}Ga_{0.85}N$ clad layer) were sequentially formed on an n type conductive GaN multiple-region substrate (conductive GaN substrate 10).

Then, DBR 223 was formed on p type clad layer 225. DBR 223 employed a multilayer structure of 60 pairs of $Al_{0.3}Ga_{0.7}N$/GaN (multilayer structure having an $Al_{0.3}Ga_{0.7}N$ layer and a GaN layer stacked alternately), i.e. a structure identical to that of DBR 213. The total thickness per pair of the $Al_{0.3}Ga_{0.7}N$ layer and GaN layer was approximately 80 nm. P$^+$ type GaN contact layer was formed as p type contact layer 229 on DBR 223. Then, insulative region 250b was formed at a portion of p type clad layer 225 and DBR 223 by selective partial insulation through mesa etching and ion implantation. Insulative region 250b was formed such that emission region 200a specified by insulative region 250b (the region defined by the opening having a circular planar shape, formed by current narrow layer 250a) is located above and within the span of low dislocation density high conductance region 10b included in conductive GaN substrate 10. The diameter D of emission region 200a was 5 µm. Then, annular semiconductor layer side electrode 15 (p side electrode) was formed on p type contact layer 229. Substrate side electrode 11 (n side electrode) was formed on the other main surface 10n of conductive GaN substrate 10. Thus, a surface-emitting laser element of the present example was obtained.

Upon applying current to the obtained surface-emitting laser element, laser oscillation at the current density of at least 6 kA/cm$^{-2}$ was observed, and light emittance thereof was uniform.

Example 3

A specific example of a surface-emitting laser element of the fifth embodiment will be described hereinafter. First, a conductive GaN multiple-region substrate (conductive GaN substrate 10) having properties similar to those of Example 1 was produced. Then, referring to FIG. 8B, group III-V compound semiconductor layer stack 20 including emission region 200 was formed on one main surface 10m of the n type conductive GaN multiple-region substrate (conductive GaN substrate 10). Semiconductor layer side electrode 15 was formed on the uppermost layer of this group III-V compound semiconductor layer stack. Substrate side electrode 11 was formed on the other main surface 10n of the n type conductive GaN multiple-region substrate (conductive GaN substrate 10). Emission region 200a of emission layer 200 was set to be located above and within the span of low dislocation density high conductance region 10b.

Group III-V compound semiconductor layer stack 20 was formed by MOCVD (Metal Oxide Chemical Vapor Deposition). Specifically, group III-V compound semiconductor layer stack 20 was formed as set forth below.

Figure 10:
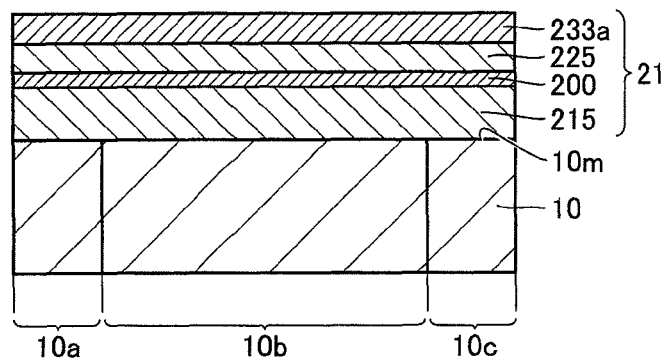
FIG. 10 is a schematic sectional view of the surface-emitting element shown in FIGS. 8A and 8B corresponding to a first step in a fabrication method thereof.

Referring to FIG. 10, a buffer layer (not shown) (n type GaN buffer layer), n type clad layer 215 (n type $Al_{0.15}Ga_{0.85}N$ clad layer), emission layer 200 ($Ga_{0.9}In_{0.1}N$/GaN multiple quantum well structure), p type clad layer 225 (p type $Al_{0.15}Ga_{0.85}N$ clad layer) and crystal layer 233a (GaN layer) to form photonic crystals were sequentially formed on the conductive GaN multiple-region substrate (conductive GaN substrate 10).

Figure 11:
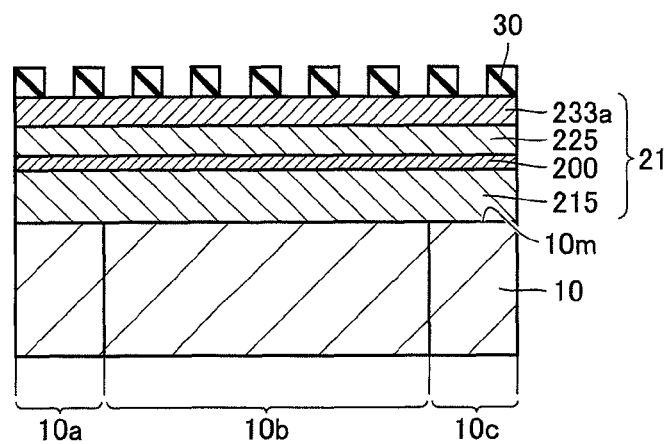
FIG. 11 is a schematic sectional view of the surface-emitting element shown in FIGS. 8A and 8B corresponding to a second step in a fabrication method thereof.

Referring to FIG. 11, a resist 30 of a predetermined pattern was formed on crystal layer 233a by electron beam exposure. Specifically, a photoresist for electron beam exposure (ZEP520: product of Zeon Corporation) was applied, and a resist pattern of microholes was drawn using an electron beam exposure machine. The pattern of resist 30 was in square lattices, corresponding to microholes of 0.06 µm in diameter at the interval of 0.16 µm.

Figure 12:
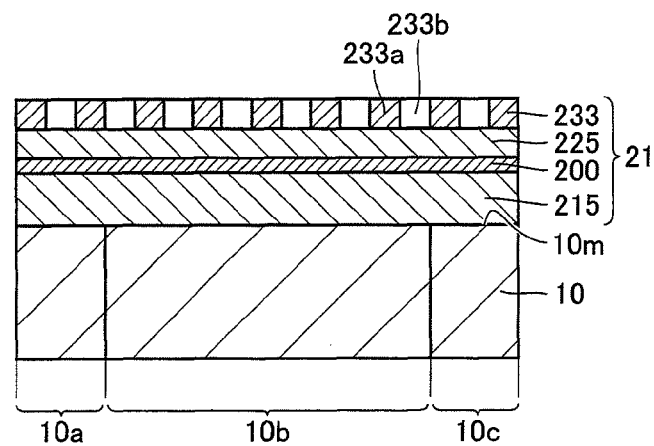
FIG. 12 is a schematic sectional view of the surface-emitting element shown in FIGS. 8A and 8B corresponding to a third step in a fabrication method thereof.

Referring to FIG. 12, crystal layer 233a was etched by ICP (Inductively coupled plasma)-RIE (Reactive Ion Etching) using resist 30 as a mask. A diffraction grating hole 233b of 0.1 µm in depth was formed at a predetermined position in crystal layer 233a to form photonic crystal layer 233. Thus, a first stack 21 was obtained. Etching was carried out in high vacuum of approximately 0.4 Pa using the mixture gas of chlorine gas and a small amount of noble gas as the etching gas. Accordingly, etching of high planarity and versatility could be performed.

Figure 13:
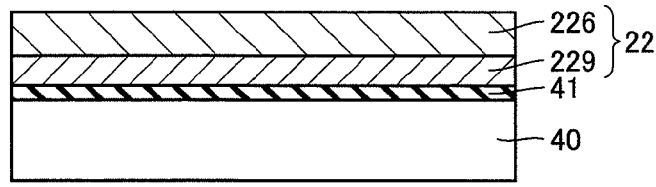
FIG. 13 is a schematic sectional view of the surface-emitting element shown in FIGS. 8A and 8B corresponding to a fourth step in a fabrication method thereof.

Referring to FIG. 13, in addition to first stack 21 of FIG. 12, a peeling layer 41 ($In_{0.4}Ga_{0.6}N$ layer), a p type contact layer 229 (p type GaN contact layer) and a p type clad layer 226 (p type Al$_{0.15}$Ga$_{0.85}$N clad layer) were formed by MOCVD on underlying substrate 40 (sapphire substrate) to obtain a second stack 22.

Figure 14:
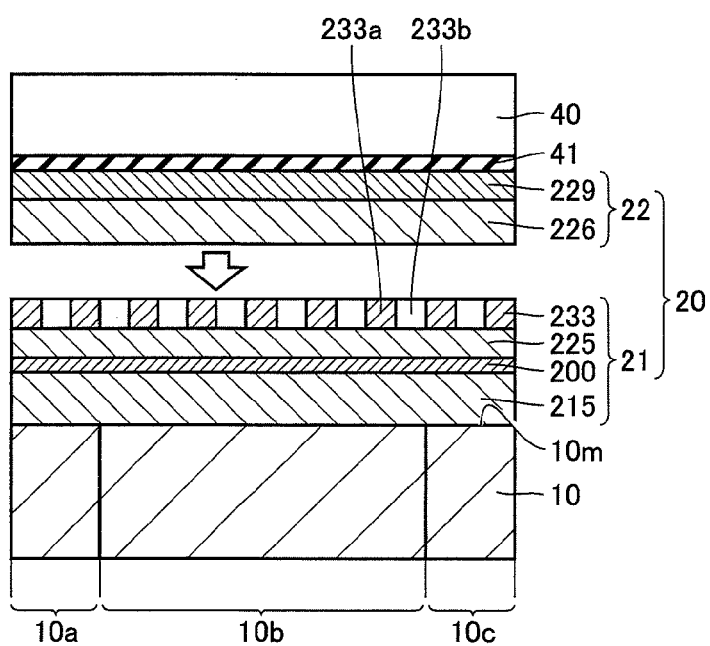
FIG. 14 is a schematic sectional view of the surface-emitting element shown in FIGS. 8A and 8B corresponding to a fifth step in a fabrication method thereof.

Referring to FIG. 14, first stack 21 was fusion-bonded with second stack 22 such that photonic crystal layer 233 of first stack 21 faces p type clad layer 226 of second stack 22. This fusion bonding was carried out at the temperature of 700° C. in nitrogen ambient.

Figure 15:
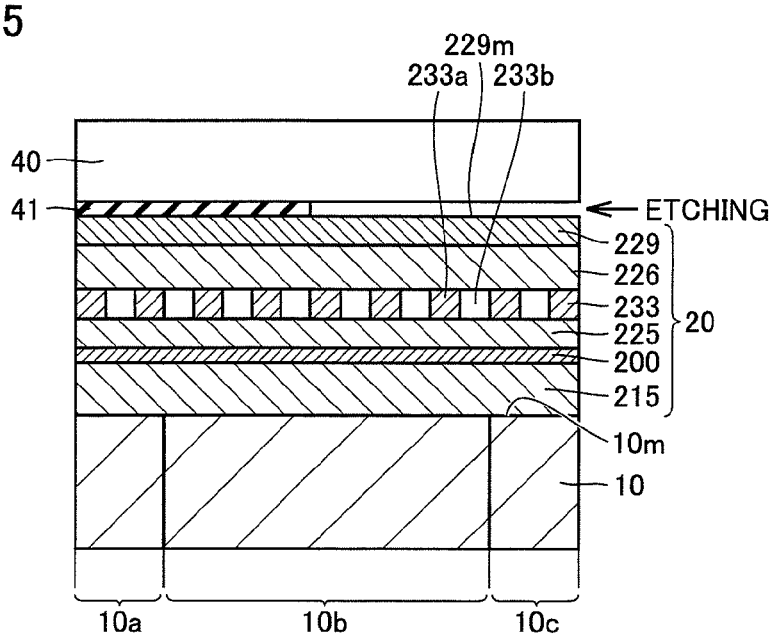
FIG. 15 is a schematic sectional view of the surface-emitting element shown in FIGS. 8A and 8B corresponding to a sixth step in a fabrication method thereof.

Referring to FIG. 15, a laser beam was applied to peeling layer 41 for lateral etching, whereby peeling layer 41 was selectively removed. Thus, p type contact layer 229 that is the uppermost layer of group III-V compound semiconductor layer stack 20 was detached from underlying substrate 40. As a result, the top surface of contact layer 229 was exposed as the light emitting face.

Referring to FIG. 8B, semiconductor layer side electrode 15 (p side electrode) was formed at a position above and within the span of low dislocation density high conductance region 10b, on p type contact layer 229, such that emission region 200a of emission layer 200 is located above and within the span of low dislocation density high conductance region 10b in conductive GaN substrate 10. Then, substrate side electrode 11 (n side electrode) was formed on the other main surface 10n of conductive GaN substrate 10 to obtain a surface-emitting laser element of the present example.

Upon applying current to the obtained surface-emitting laser element, laser oscillation at the current density of at least 5 kA/cm$^{-2}$ was observed, and light emittance thereof was uniform.

As set forth above, a conductive GaN multiple-region substrate including a high dislocation density high conductance region 10a having a high dislocation density and carrier concentration, a low dislocation density high conductance region 10b having a dislocation density lower than that of the high dislocation density high conductance region, and a low dislocation density low conductance region 10c having a dislocation density and carrier concentration lower than those of the high dislocation density high conductance region was prepared as conductive GaN substrate 10 in the fabrication of surface-emitting laser element 1. Group III-V compound semiconductor layer stack 20 is formed on the conductive GaN multiple-region substrate (conductive GaN substrate 10), such that the emission region included in the emission layer is located above and within the span of the low dislocation density high conductance region. Therefore, the current flowing into the emission region is uniform. Thus, a surface-emitting laser element 1 having uniform light emission in the emission region was obtained with favorable yield.

The invention claimed is:

1. A fabrication method of a surface-emitting laser element, Comprising:
preparing a conductive GaN multiple-region substrate including a conductive GaN substrate with a high dislocation density high conductance region having a high dislocation density and carrier concentration, a low dislocation density high conductance region having a dislocation density lower than the dislocation density of said high dislocation density high conductance region, and a low dislocation density low conductance region having a dislocation density and carrier concentration lower than the dislocation density and carrier concentration of said high dislocation density high conductance region,
forming a group III-V compound semiconductor layer stack including an emission layer on one main surface of said conductive GaN multiple-region substrate, and
forming a semiconductor layer side electrode on an uppermost layer of said group III-V compound semiconductor layer stack, and a substrate side electrode on an other main surface of said conductive GaN multiple-region substrate,
wherein said group III-V compound semiconductor layer stack, said semiconductor layer side electrode, and said substrate side electrode are formed such that an emission region into which carriers flow in said emission layer is limited to be located above and within a span of said low dislocation density high conductance region, said high dislocation density high conductance region is a region having a dislocation density of at least 1×10$^6$ cm$^{-2}$ and a carrier concentration of at least 1×10$^{18}$ cm$^{-3}$, said low dislocation density high conductance region is a region having a dislocation density less than 1×10$^6$ cm$^{-2}$ and a carrier concentration of at least 1×10$^{18}$ cm$^{-3}$, and said low dislocation density low conductance region is a region having a dislocation density less than 1×10$^6$ cm$^{-2}$ and a carrier concentration less 1×10$^{18}$ cm$^{-3}$.

2. The fabrication method of a surface-emitting laser element according to claim 1, wherein said semiconductor layer side electrode is formed at a location above and within the span of said low dislocation density high conductance region, such that said emission region is limited to be located above and within the span of said low dislocation density high conductance region, in said electrode formation step.

3. The fabrication method of a surface-emitting laser element according to claim 1, further comprising forming a carrier narrow region in said group III-V compound semiconductor layer stack, such that said emission region is limited to be located above and within the span of said low dislocation density high conductance region, in said semiconductor layer stack formation step.

4. The fabrication method of a surface-emitting laser element according to claim 1, wherein said high dislocation density high conductance region is formed in dots, each dot of said high dislocation density high conductance region arranged on periodic triangular lattice points or square lattice points with a lattice constant of PD on the main surface of said conductive GaN multiple-region substrate, and
said low dislocation density high conductance region is a region excluding said each dot from a circular region with a radius PD/2 about the center of said each dot.

5. The fabrication method of a surface-emitting laser element according to claim 1, wherein said high dislocation density high conductance region is formed in stripes, each stripe of said high dislocation density high conductance region arranged on the main surface of said conductive GaN multiple-region substrate in a periodic interval of PS, and said low dislocation density high conductance region is a region excluding, from an entire region of said conductive GaN multiple-region substrate, said each stripe and said low dislocation density low conductance region formed with the center located PS/2 from the center of said each stripe.

6. A surface-emitting laser element comprising a conductive GaN substrate, a group III-V compound semiconductor layer stack including an emission layer formed on one main surface of said conductive GaN substrate, a semiconductor layer side electrode formed on an uppermost layer of said group III-V compound semiconductor layer stack, and a substrate side electrode formed on an other main surface of said conductive GaN substrate, wherein:
said conductive GaN substrate includes a low dislocation density high conductance region having a dislocation density less than $1\times10^6$ cm$^{-2}$ and a carrier concentration of at least $1\times10^{18}$ cm$^{-3}$, and at least one of a high dislocation density high conductance region having a dislocation density of at least $1\times10^6$ cm$^{-2}$ and a carrier concentration of at least $1\times10^{18}$ cm$^{-3}$, and a low dislocation density low conductance region having a dislocation density less than $1\times10^6$ cm$^{-2}$ and a carrier concentration less than $1\times10^{18}$ cm$^{-3}$; and an emission region into which carriers flow in said emission layer is located above and within a span of said low dislocation density high conductance region.

7. The surface-emitting laser element according to claim 6, wherein said semiconductor layer side electrode is formed at a position above and within the span of said low dislocation density high conductance region, such that said emission region is located above and within the span of said low dislocation density high conductance region.

8. The surface-emitting laser element according to claim 6, wherein a carrier narrow region is formed in said group III-V compound semiconductor layer stack, such that said emission region is located above and within the span of said low dislocation density high conductance region.

* * * * *